US012750070B2

(12) United States Patent
Sforzin

(10) Patent No.: US 12,750,070 B2
(45) Date of Patent: Sep. 29, 2026

(54) ENCODING METADATA INFORMATION IN A CODEWORD

(71) Applicant: Micron Technology, Inc., Boise, ID (US)

(72) Inventor: Marco Sforzin, Cernusco sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 85 days.

(21) Appl. No.: 18/987,205

(22) Filed: Dec. 19, 2024

(65) Prior Publication Data

US 2025/0233601 A1 Jul. 17, 2025

Related U.S. Application Data

(60) Provisional application No. 63/621,747, filed on Jan. 17, 2024.

(51) Int. Cl.
*H03M 13/15* (2006.01)
*H03M 13/11* (2006.01)

(52) U.S. Cl.
CPC .... *H03M 13/1575* (2013.01); *H03M 13/1111* (2013.01)

(58) Field of Classification Search
CPC .......... H03M 13/1575; H03M 13/1111; H03M 13/1171; H03M 13/1174; G11C 29/42
See application file for complete search history.

(56) References Cited

U.S. PATENT DOCUMENTS

2016/0188219 A1* 6/2016 Peterson ............. G06F 12/0246 711/103
2022/0229723 A1* 7/2022 Fryman ................. G06F 9/3001
2024/0272981 A1* 8/2024 Mccrate .............. G06F 11/1016
2024/0380415 A1* 11/2024 Dakshinamoorthy ....................... H03M 13/1108
2025/0165383 A1* 5/2025 Ayyapureddi ...... G11C 11/4096

OTHER PUBLICATIONS

A. Karimi, K. I. Pedersen, N. H. Mahmood, G. Berardinelli and P. Mogensen, "On the Multiplexing of Data and Metadata for Ultra-Reliable Low-Latency Communications in 5G," in IEEE Transactions on Vehicular Technology, vol. 69, No. 10, pp. 12136-12147, Oct. 2020 (Year: 2020).*

* cited by examiner

*Primary Examiner* — Cynthia Britt
(74) *Attorney, Agent, or Firm* — Harrity & Harrity, LLP

(57) ABSTRACT

In some implementations, a memory device may encode a codeword that encodes multiple data bits, multiple parity bits, and at least one metadata bit. The memory device may perform a first decoding procedure using the codeword to determine a first decoded set of bits by using a first hypothesized value of the at least one metadata bit. The memory device may perform a second decoding procedure to determine a second decoded set of bits by using a second hypothesized value of the at least one metadata bit. The memory device may determine, using the first decoded set of bits and the second decoded set of bits, whether the first hypothesized value of the at least one metadata bit or the second hypothesized value of the at least one metadata bit is a value of the at least one metadata bit.

20 Claims, 13 Drawing Sheets

ENCODING METADATA INFORMATION IN A CODEWORD

CROSS-REFERENCE TO RELATED APPLICATION

This Patent Application claims priority to U.S. Provisional Patent Application No. 63/621,747, filed on Jan. 17, 2024, entitled "ENCODING METADATA INFORMATION IN A CODEWORD," and assigned to the assignee hereof. The disclosure of the prior Application is considered part of and is incorporated by reference into this Patent Application.

TECHNICAL FIELD

The present disclosure generally relates to memory devices, memory device operations, and, for example, to encoding metadata information in a codeword.

BACKGROUND

Memory devices are widely used to store information in various electronic devices. A memory device includes memory cells. A memory cell is an electronic circuit capable of being programmed to a data state of two or more data states. For example, a memory cell may be programmed to a data state that represents a single binary value, often denoted by a binary "1" or a binary "0." As another example, a memory cell may be programmed to a data state that represents a fractional value (e.g., 0.5, 1.5, or the like). To store information, an electronic device may write to, or program, a set of memory cells. To access the stored information, the electronic device may read, or sense, the stored state from the set of memory cells.

Various types of memory devices exist, including random access memory (RAM), read only memory (ROM), dynamic RAM (DRAM), static RAM (SRAM), synchronous dynamic RAM (SDRAM), ferroelectric RAM (FeRAM), magnetic RAM (MRAM), resistive RAM (RRAM), holographic RAM (HRAM), flash memory (e.g., NAND memory and NOR memory), and others. A memory device may be volatile or non-volatile. Non-volatile memory (e.g., flash memory) can store data for extended periods of time even in the absence of an external power source. Volatile memory (e.g., DRAM) may lose stored data over time unless the volatile memory is refreshed by a power source. In some examples, a memory device may be associated with a compute express link (CXL). For example, the memory device may be a CXL compliant memory device and/or may include a CXL interface.

DETAILED DESCRIPTION

Host data or similar data may be stored in memory using multiple dies or similar components, such as by striping the host data across multiple data dies and one or more parity dies. The data dies may be used to store the host data, while the parity dies may be used to store parity bits used for error correction, such as for a purpose of correcting corrupted or unreadable data in the data dies. In some cases, the parity dies may be used to store bits used in connection with a chipkill protection scheme, in which data stored on a given die may be corrected in the event that an entire die of a memory becomes unusable. However, chipkill protection schemes may rely on full redundancy for error correction and/or may not permit metadata bits to be transmitted with a codeword during a read operation. In some instances, however, it may be beneficial to convey metadata information along with a codeword, such as by conveying one or more compute express link (CXL) metadata bits, a poison bit, a trusted executed environment (TEE) bit, and/or other types of metadata bits. Because traditional chipkill protection schemes rely on full redundancy and thus cannot support transmission of metadata bits, memory devices employing chipkill protection may be required to forgo transmission of metadata, resulting in decreased reliability of a memory system and/or corrupted data, leading to increased power, computing, storage, and other resource consumption for identifying and correcting memory operation errors.

Some implementations described herein enable transmission of metadata bits with a codeword, thereby resulting in improved information flow, increased reliability of memory systems, and decreased power, computing, storage, and other resource consumption otherwise required for identifying and correcting memory operation errors. In some implementations, metadata bits may be added to a codeword by shortening a data portion of a code, thereby enabling metadata to be encoded into the codeword without requiring storage of the metadata within a data portion of a memory stripe (e.g., within data dies) and/or without requiring transmission of the metadata bits in a channel. A decoder may perform parallel decoding of the codeword in order to identify a value of the metadata bits, such as by decoding the codeword using multiple hypotheses of the value of the metadata bits and/or by identifying which of the hypotheses results in a correctly decoded set of bits. As a result, metadata bits may be encoded within a codeword in a memory system, resulting in improved reliability and accuracy of data storage and transmission, reduction in data corruption incidents, enhanced system stability, enhanced data security and confidentiality, reduced latency in high-priority data processing, quick identification and isolation of corrupt data, and overall more efficient memory system operations.

Figure 1:
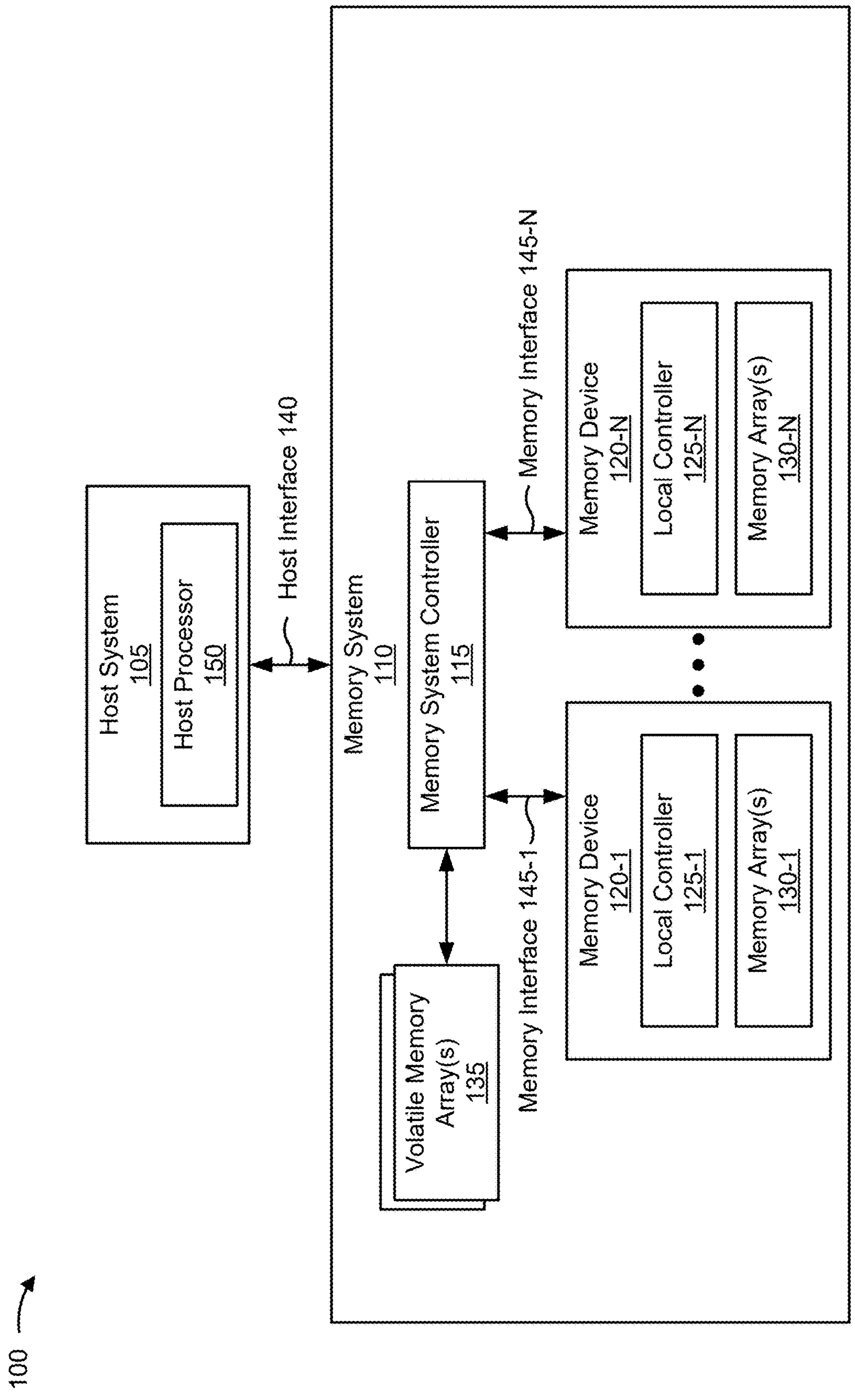
FIG. 1 is a diagram illustrating an example system capable of encoding metadata information in a codeword.

FIG. 1 is a diagram illustrating an example system 100 capable of encoding metadata information in a codeword. The system 100 may include one or more devices, apparatuses, and/or components for performing operations described herein. For example, the system 100 may include a host system 105 and a memory system 110. The memory system 110 may include a memory system controller 115 and one or more memory devices 120, shown as memory devices 120-1 through 120-N (where N≥1). A memory device may include a local controller 125 and one or more memory arrays 130. The host system 105 may communicate with the memory system 110 (e.g., the memory system controller 115 of the memory system 110) via a host interface 140. The memory system controller 115 and the memory devices 120 may communicate via respective memory interfaces 145, shown as memory interfaces 145-1 through 145-N (where N≥1).

The system 100 may be any electronic device configured to store data in memory. For example, the system 100 may be a computer, a mobile phone, a wired or wireless communication device, a network device, a server, a device in a data center, a device in a cloud computing environment, a vehicle (e.g., an automobile or an airplane), and/or an Internet of Things (IoT) device. The host system 105 may include a host processor 150. The host processor 150 may include one or more processors configured to execute instructions and store data in the memory system 110. For example, the host processor 150 may include a central processing unit (CPU), a graphics processing unit (GPU), a field-programmable gate array (FPGA), an application-specific integrated circuit (ASIC), and/or another type of processing component.

The memory system 110 may be any electronic device or apparatus configured to store data in memory. For example, the memory system 110 may be a hard drive, a solid-state drive (SSD), a flash memory system (e.g., a NAND flash memory system or a NOR flash memory system), a universal serial bus (USB) drive, a memory card (e.g., a secure digital (SD) card), a secondary storage device, a non-volatile memory express (NVMe) device, an embedded multimedia card (eMMC) device, a dual in-line memory module (DIMM), and/or a random-access memory (RAM) device, such as a dynamic RAM (DRAM) device or a static RAM (SRAM) device.

The memory system controller 115 may be any device configured to control operations of the memory system 110 and/or operations of the memory devices 120. For example, the memory system controller 115 may include control logic, a memory controller, a system controller, an ASIC, an FPGA, a processor, a microcontroller, and/or one or more processing components. In some implementations, the memory system controller 115 may communicate with the host system 105 and may instruct one or more memory devices 120 regarding memory operations to be performed by those one or more memory devices 120 based on one or more instructions from the host system 105. For example, the memory system controller 115 may provide instructions to a local controller 125 regarding memory operations to be performed by the local controller 125 in connection with a corresponding memory device 120.

A memory device 120 may include a local controller 125 and one or more memory arrays 130. In some implementations, a memory device 120 includes a single memory array 130. In some implementations, each memory device 120 of the memory system 110 may be implemented in a separate semiconductor package or on a separate die that includes a respective local controller 125 and a respective memory array 130 of that memory device 120. The memory system 110 may include multiple memory devices 120.

A local controller 125 may be any device configured to control memory operations of a memory device 120 within which the local controller 125 is included (e.g., and not to control memory operations of other memory devices 120). For example, the local controller 125 may include control logic, a memory controller, a system controller, an ASIC, an FPGA, a processor, a microcontroller, and/or one or more processing components. In some implementations, the local controller 125 may communicate with the memory system controller 115 and may control operations performed on a memory array 130 coupled with the local controller 125 based on one or more instructions from the memory system controller 115. As an example, the memory system controller 115 may be an SSD controller, and the local controller 125 may be a NAND controller.

A memory array 130 may include an array of memory cells configured to store data. For example, a memory array 130 may include a non-volatile memory array (e.g., a NAND memory array or a NOR memory array) or a volatile memory array (e.g., an SRAM array or a DRAM array). In some implementations, the memory system 110 may include one or more volatile memory arrays 135. A volatile memory array 135 may include an SRAM array and/or a DRAM array, among other examples. The one or more volatile memory arrays 135 may be included in the memory system controller 115, in one or more memory devices 120, and/or in both the memory system controller 115 and one or more memory devices 120. In some implementations, the memory system 110 may include both non-volatile memory capable of maintaining stored data after the memory system 110 is powered off and volatile memory (e.g., a volatile memory array 135) that requires power to maintain stored data and that loses stored data after the memory system 110 is powered off. For example, a volatile memory array 135 may cache data read from or to be written to non-volatile memory, and/or may cache instructions to be executed by a controller of the memory system 110.

The host interface 140 enables communication between the host system 105 (e.g., the host processor 150) and the memory system 110 (e.g., the memory system controller 115). The host interface 140 may include, for example, a Small Computer System Interface (SCSI), a Serial-Attached SCSI (SAS), a Serial Advanced Technology Attachment (SATA) interface, a Peripheral Component Interconnect Express (PCIe) interface, an NVMe interface, a USB interface, a Universal Flash Storage (UFS) interface, an eMMC interface, a double data rate (DDR) interface, and/or a DIMM interface.

The memory interface 145 enables communication between the memory system 110 and the memory device 120. The memory interface 145 may include a non-volatile memory interface (e.g., for communicating with non-volatile memory), such as a NAND interface or a NOR interface. Additionally, or alternatively, the memory interface 145 may include a volatile memory interface (e.g., for communicating with volatile memory), such as a DDR interface.

In some examples, the memory system 110 may be a compute express link (CXL) compliant memory system (sometimes referred to herein simply as a CXL memory system) and/or one or more of the memory devices 120 may be CXL compliant memory devices (sometimes referred to herein simply as a CXL memory device). CXL is a high-speed CPU-to-device and CPU-to-memory interconnect designed to accelerate next-generation performance. CXL technology maintains memory coherency between the CPU memory space and memory on attached devices, which allows resource sharing for higher performance, reduced software stack complexity, and lower overall system cost. CXL is designed to be an industry open standard interface for high-speed communications. CXL technology is built on the PCIe infrastructure, leveraging PCIe physical and electrical interfaces to provide an advanced protocol in areas such as input/output (I/O) protocol, memory protocol, and coherency interface.

In some examples, the memory system 110 may include a PCIe/CXL interface (e.g., the host interface 140 may be associated with a PCIe/CXL interface), which may be a physical interface configured to connect the CXL memory system and/or the CXL memory device to CXL compliant host devices. In such examples, the PCIe/CXL interface may comply with CXL standard specifications for physical connectivity, ensuring broad compatibility and ease of integration into existing systems using the CXL protocol. Additionally, or alternatively, a CXL memory system and/or a CXL memory device may be designed to efficiently interface with computing systems (e.g., the host system 105) by leveraging the CXL protocol. For example, a CXL memory system and/or a CXL memory device may be configured to utilize high-speed, low-latency interconnect capabilities of CXL, such as for a purpose of making the CXL memory system and/or the CXL memory device suitable for high-performance computing, data center applications, artificial intelligence (AI) applications, and/or similar applications.

A CXL memory system and/or a CXL memory device may include a CXL memory controller (e.g., memory system controller 115 and/or local controller 125), which may be configured to manage data flow between memory arrays (e.g., volatile memory arrays 135 and/or memory arrays 130) and a CXL interface (e.g., a PCIe/CXL interface, such as host interface 140). In some examples, the CXL memory controller may be configured to handle one or more CXL protocol layers, such as an I/O layer (e.g., a layer associated with a CXL.io protocol, which may be used for purposes such as device discovery, configuration, initialization, I/O virtualization, direct memory access (DMA) using non-coherent load-store semantics, and/or similar purposes); a cache coherency layer (e.g., a layer associated with a CXL.cache protocol, which may be used for purposes such as caching host memory using a modified, exclusive, shared, invalid (MESI) coherence protocol, or similar purposes); or a memory protocol layer (e.g., a layer associated with a CXL.memory (sometimes referred to as CXL.mem) protocol, which may enable a CXL memory device to expose host-managed device memory (HDM) to permit a host device to manage and access memory similar to a native DDR connected to the host); among other examples.

A CXL memory system and/or a CXL memory device may further include and/or be associated with one or more high-bandwidth memory modules (HBMMs) or similar memory arrays (e.g., volatile memory arrays 135 and/or memory arrays 130). For example, a CXL memory system and/or a CXL memory device may include multiple layers of DRAM (e.g., stacked and/or interconnected through advanced through-silicon via (TSV) technology) in order to maximize storage density and/or enhance data transfer speeds between memory layers. Additionally, or alternatively, a CXL memory system and/or a CXL memory device may include a power management unit, which may be configured to regulate power consumption associated with the CXL memory system and/or the CXL memory device and/or which may be configured to improve energy efficiency for the CXL memory system and/or the CXL memory device. Additionally, or alternatively, a CXL memory system and/or a CXL memory device may include additional components, such as one or more error correction code (ECC) engines, such as for a purpose of detecting and/or correcting data errors to ensure data integrity and/or improve the overall reliability of the CXL memory system and/or the CXL memory device.

Although the example memory system 110 described above includes a memory system controller 115, in some implementations, the memory system 110 does not include a memory system controller 115. For example, an external controller (e.g., included in the host system 105) and/or one or more local controllers 125 included in one or more corresponding memory devices 120 may perform the operations described herein as being performed by the memory system controller 115. Furthermore, as used herein, a "controller" may refer to the memory system controller 115, a local controller 125, or an external controller. In some implementations, a set of operations described herein as being performed by a controller may be performed by a single controller. For example, the entire set of operations may be performed by a single memory system controller 115, a single local controller 125, or a single external controller. Alternatively, a set of operations described herein as being performed by a controller may be performed by more than one controller. For example, a first subset of the operations may be performed by the memory system controller 115 and a second subset of the operations may be performed by a local controller 125. Furthermore, the term "memory apparatus" may refer to the memory system 110 or a memory device 120, depending on the context.

A controller (e.g., the memory system controller 115, a local controller 125, or an external controller) may control operations performed on memory (e.g., a memory array 130), such as by executing one or more instructions. For example, the memory system 110 and/or a memory device 120 may store one or more instructions in memory as firmware, and the controller may execute those one or more instructions. Additionally, or alternatively, the controller may receive one or more instructions from the host system 105 and/or from the memory system controller 115, and may execute those one or more instructions. In some implementations, a non-transitory computer-readable medium (e.g., volatile memory and/or non-volatile memory) may store a set of instructions (e.g., one or more instructions or code) for execution by the controller. The controller may execute the set of instructions to perform one or more operations or methods described herein. In some implementations, execution of the set of instructions, by the controller, causes the controller, the memory system 110, and/or a memory device 120 to perform one or more operations or methods described herein. In some implementations, hardwired circuitry is used instead of or in combination with the one or more instructions to perform one or more operations or methods described herein. Additionally, or alternatively, the controller may be configured to perform one or more operations or methods described herein. An instruction is sometimes called a "command."

For example, the controller (e.g., the memory system controller 115, a local controller 125, or an external controller) may transmit signals to and/or receive signals from memory (e.g., one or more memory arrays 130) based on the one or more instructions, such as to transfer data to (e.g., write or program), to transfer data from (e.g., read), to erase, and/or to refresh all or a portion of the memory (e.g., one or more memory cells, pages, sub-blocks, blocks, or planes of the memory). Additionally, or alternatively, the controller may be configured to control access to the memory and/or to provide a translation layer between the host system 105 and the memory (e.g., for mapping logical addresses to physical addresses of a memory array 130). In some implementations, the controller may translate a host interface command (e.g., a command received from the host system 105) into a memory interface command (e.g., a command for performing an operation on a memory array 130).

In some implementations, one or more systems, devices, apparatuses, components, and/or controllers of FIG. 1 may be configured to receive a codeword that encodes a data vector, a parity vector associated with error correction of the data vector, and a metadata bit; and determine a value of the metadata bit by: performing a first decoding procedure to determine a first syndrome, wherein the first decoding procedure is based on using a first hypothesized value of the metadata bit; performing a second decoding procedure to determine a second syndrome, wherein the second decoding procedure is based on using a second hypothesized value of the metadata bit; and selecting, using the first syndrome and the second syndrome, one of the first hypothesized value of the metadata bit or the second hypothesized value of the metadata bit as the value of the metadata bit.

In some implementations, one or more systems, devices, apparatuses, components, and/or controllers of FIG. 1 may be configured to encode a codeword that encodes multiple data bits associated with a portion of memory, multiple parity bits associated with error correction of the multiple data bits, and at least one metadata bit; perform a first decoding procedure using the codeword to determine a first decoded set of bits, wherein the first decoding procedure is based on using a first hypothesized value of the at least one metadata bit; perform a second decoding procedure using the codeword to determine a second decoded set of bits, wherein the second decoding procedure is based on using a second hypothesized value of the at least one metadata bit; and determine, using the first decoded set of bits and the second decoded set of bits, whether the first hypothesized value of the at least one metadata bit or the second hypothesized value of the at least one metadata bit is a value of the at least one metadata bit.

In some implementations, one or more systems, devices, apparatuses, components, and/or controllers of FIG. 1 may include multiple error correction code engines, wherein each error correction code engine, of the multiple error correction code engines, includes multiple decoders, and wherein each error correction engine is configured to: receive a codeword that encodes a data vector, a parity vector associated with error correction of the data vector, and a metadata bit; and determine a value of the metadata bit by: performing, using a first decoder, of the multiple decoders, a first decoding procedure to determine a first syndrome, wherein the first decoding procedure is based on using a first hypothesized value of the metadata bit; performing, using a second decoder, of the multiple decoders, a second decoding procedure to determine a second syndrome, wherein the second decoding procedure is based on using a second hypothesized value of the metadata bit; and selecting one of the first hypothesized value of the metadata bit or the second hypothesized value of the metadata bit as the value of the metadata bit based on the first syndrome, the second syndrome, and syndromes determined by one or more other error correction code engines, of the multiple error correction code engines.

The number and arrangement of components shown in FIG. 1 are provided as an example. In practice, there may be additional components, fewer components, different components, or differently arranged components than those shown in FIG. 1. Furthermore, two or more components shown in FIG. 1 may be implemented within a single component, or a single component shown in FIG. 1 may be implemented as multiple, distributed components. Additionally, or alternatively, a set of components (e.g., one or more components) shown in FIG. 1 may perform one or more operations described as being performed by another set of components shown in FIG. 1.

FIGS. 2A-2E are diagrams of examples associated with error correction codes. The operations described in connection with FIGS. 2A-2E may be performed by the memory system 110 and/or one or more components of the memory system 110, such as the memory system controller 115, one or more memory devices 120, one or more local controllers 125, and/or one or more error correction code (ECC) engines associated with the memory system 110 and/or one more memory devices 120.

Figure 2A:
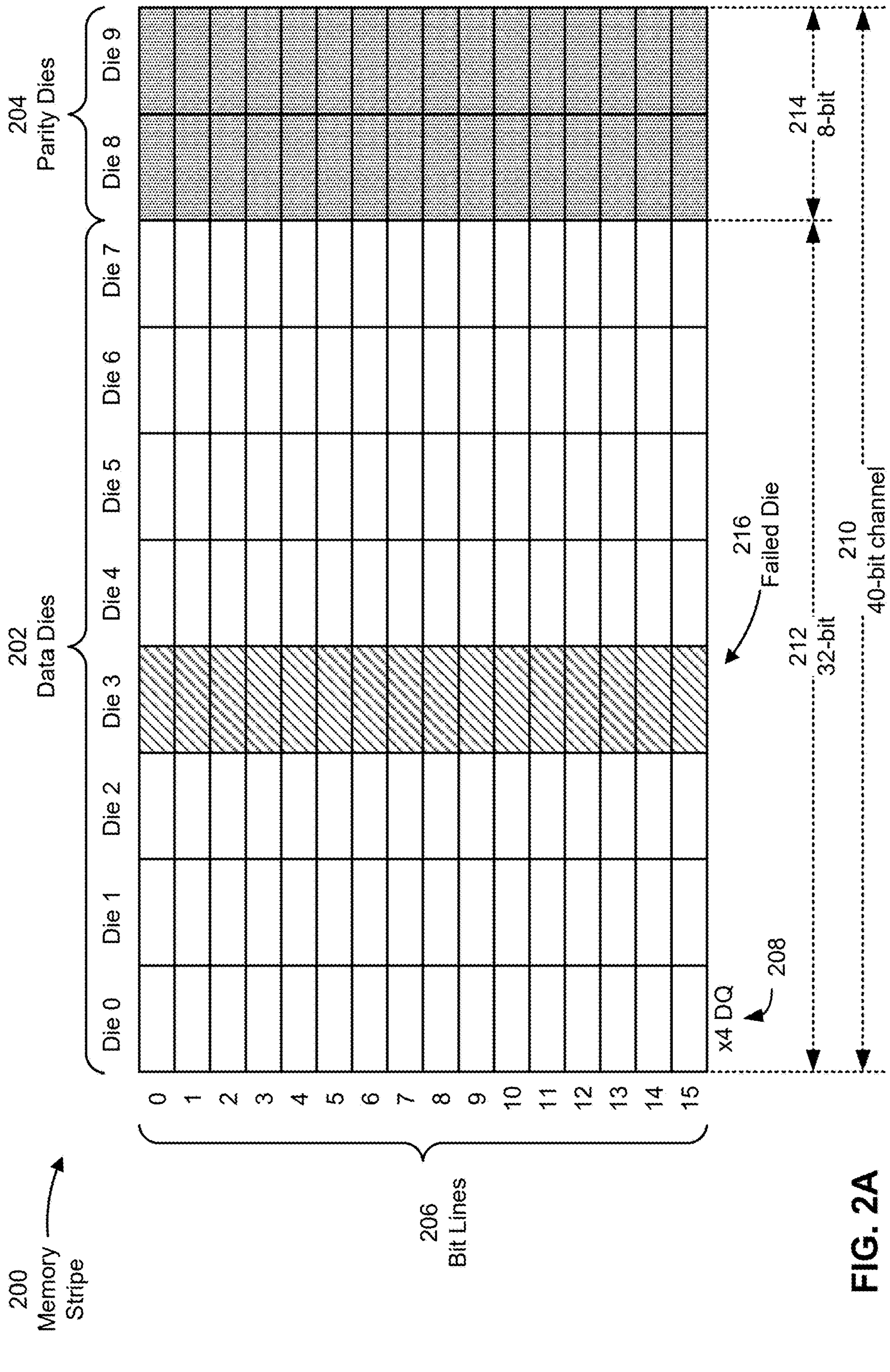
FIGS. 2A-2E are diagrams of examples associated with error correction codes.

As shown in FIG. 2A, and as indicated by reference number 200, an ECC may be used in connection with a memory stripe (sometimes referred to as a data block, a data frame, and/or a similar term), which may correspond to the volatile memory arrays 135 described above in connection with FIG. 1. In some examples, the memory stripe may be associated with a memory channel (e.g., a data pathway between memory and other components of a memory device, such as a memory controller and/or a processor), with a "width" of the memory channel (e.g., measured in bits) referring to a quantity of bits that may be transferred in one operation and/or one memory cycle. For example, as described in more detail below, in some examples the memory stripe may be associated with a 40-bit channel, and thus a memory device associated with the memory stripe may be referred to as a 40-bit memory device. For example, the memory device may be a double data rate 5 (DDR5) 40-bit memory device, or a similar device.

The memory stripe may be associated with multiple dies of memory used to store data bits and/or parity bits. Put another way, in some examples multiple data bits and/or parity bits may be striped across multiple dies associated with the memory stripe. For example, the memory stripe shown in FIG. 2A is associated with ten dies (e.g., ten DRAM dies), indexed as Die 0 through Die 9, with Dies 0-7 used to store data bits (and thus referred to as data dies, as indicated by reference number 202) and with Dies 8-9 used to store parity bits for error correction purposes (and thus referred to as parity dies, as indicated by reference number 204). As indicated by reference number 206, each die may be associated with sixteen bit lines (indexed 0 through 15) and/or, as indicated by reference number 208, each die may be configured in a "by four" (×4) configuration, such that each die includes four input/output pins (sometimes referred to as DQ pins). In this regard, each die may be capable of storing 64 bits (e.g., 8 bytes). In some examples, the memory stripe may be associated with 64 bytes of data (corresponding to the eight data dies indicated by reference number 202, each capable of storing 8 bytes) and 16 bytes of parity (corresponding to the two parity dies indicated by reference number 204, each capable of storing 8 bytes). Moreover, as indicated by reference number 210, the memory stripe may be associated with a 40-bit channel, of which 32 bits may be associated with data bits (as indicated by reference number 212) and 8 bits may be associated with parity bits (as indicated by reference number 214).

In some examples, the parity dies may store information that can be used in connection with an ECC to correct data, such as in an event in which an entire die fails (sometimes referred to as a chipkill protection). Put another way, an error correction system associated with the memory stripe may be able to correct errors due to an entire die failure. For example, as indicated by reference number 216, in some events an entire die of DRAM stack may fail (e.g., in the depicted example, Die 3 fails). In such cases, the parity bits stored in the parity dies may be encoded in such a way that the parity bits may be used to recover data that is stored on the failed die.

Figure 2B:
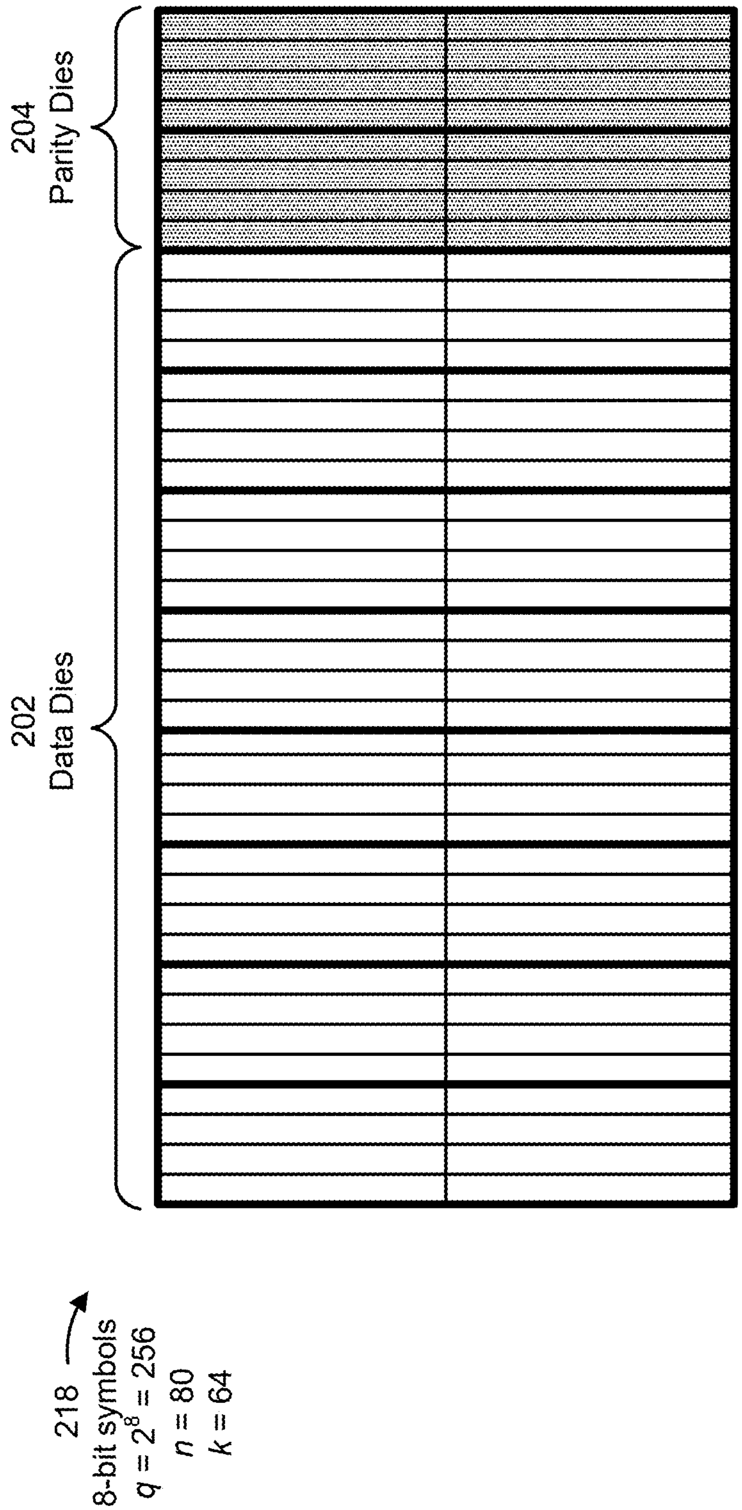
Figure 2C:
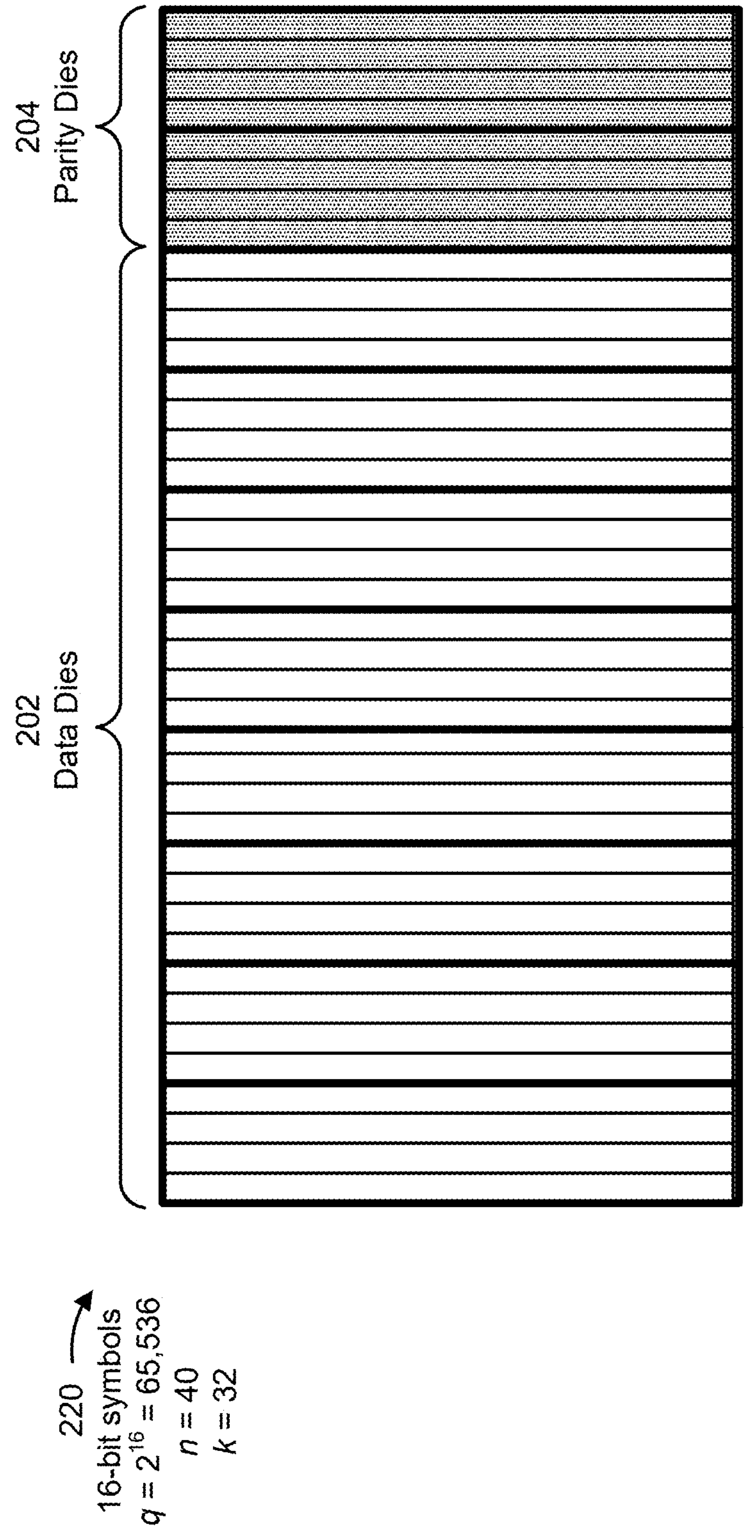

More particularly, FIGS. 2B and 2C show examples in which the parity dies are associated with Reed-Solomon (RS) codes and/or in which the memory stripe is associated with an RS chipkill protection scheme. As shown in FIG. 2B, and as indicated by reference number 218, a chipkill protection scheme may be obtained by using an RS code with 8-bit symbols. In such cases, a size of a symbol set (sometimes referred to as q) used in the RS coding scheme for the 40-bit memory stripe described above in connection with FIG. 2A may be equal to 256 (e.g., $2^8$), a length of an RS codeword (sometimes referred to as n) may be 80 symbols, and a length of the data portion of the RS codeword (sometimes referred to as k) may be 64 symbols. In some examples, RS codes may be capable of correcting up to t symbols, with t being equal to $$\frac{n-k}{2}.$$

Thus, for the 8-bit symbol example shown in FIG. 2B, the RS code may be capable of correcting up to $$\frac{80-64}{2}=8$$

symbols (e.g., 8 bytes), which is equivalent to an amount of data stored on one die. In this regard, the 8-bit RS code may be used to provide chipkill protection in an event in which an entire die of the memory stripe fails.

Similarly, as shown in FIG. 2C, and as indicated by reference number 220, a chipkill protection scheme may be alternatively obtained by using an RS code with 16-bit symbols. In such cases, a size of a symbol set (e.g., q) used in the RS coding scheme for the 40-bit data frame described above in connection with FIG. 2A may be equal to 65,536 (e.g., $2^{16}$), a length of the RS codeword (e.g., n) may be 40 symbols, and a length of the data portion of the RS codeword (e.g., k) may be 32 symbols. Thus, the 16-bit symbol example may be capable of correcting up to 4 symbols (e.g., $$\frac{n-k}{2}=\frac{40-32}{2}=4$$

symbols, or 8 bytes), which is equivalent to an amount of data stored on one die. In this regard, the 16-bit RS code may also be used to provide chipkill protection in an event in which an entire die of the memory stripe fails.

In some other examples, a non-binary Hamming code may be used to provide chipkill protection for a memory, such as the 40-bit channel memory described above in connection with FIG. 2A. In some examples, a non-binary Hamming code used to provide chipkill protection for a memory stripe may use q elements of a Galois field (GF) as its symbols (sometimes referred to as GF(q)) and/or may be associated with a redundancy r (e.g., the non-binary Hamming code may use r parity symbols). In such examples, the non-binary Hamming code may be a linear code with a length N (e.g., a length of the code may include N symbols) and a dimension K (e.g., a dimension of the code may be K symbols), in which $$N=\frac{q^r-1}{q-1}$$

and in which K=N−r. In some examples, non-binary Hamming codes may be considered "perfect codes" in that non-binary Hamming codes are capable of providing a most efficient error correction for a given set of parameters (e.g., a non-binary Hamming code may correct errors within a certain radius without wasting any space on unnecessary redundancy). More particularly, non-binary Hamming codes may be perfect codes with a minimum distance of three, in which a set of Hamming spheres of radius 1 centered in the codeword is a partition of an entire space of all possible patterns of N symbols in the alphabet GF(q), such that all space available to correct an error is exploited. In some examples, a primitive non-binary Hamming code may be completely described by its parity check matrix H. In such examples, a column of H may be all the possible vectors of r symbols that are linearly independent of each other. That is, $$H=\begin{bmatrix}1 & 0 & 1 & 1 & 1 & 1 & \dots & 1 & 1\\ 0 & 1 & 1 & \alpha & \alpha^2 & \alpha^3 & \dots & \alpha^{q-3} & \alpha^{q-2}\end{bmatrix},$$

in which α corresponds to a primitive element (e.g., an element that can generate all other non-zero elements of the finite field (e.g., GF(q)) through its powers).

Figure 2D:
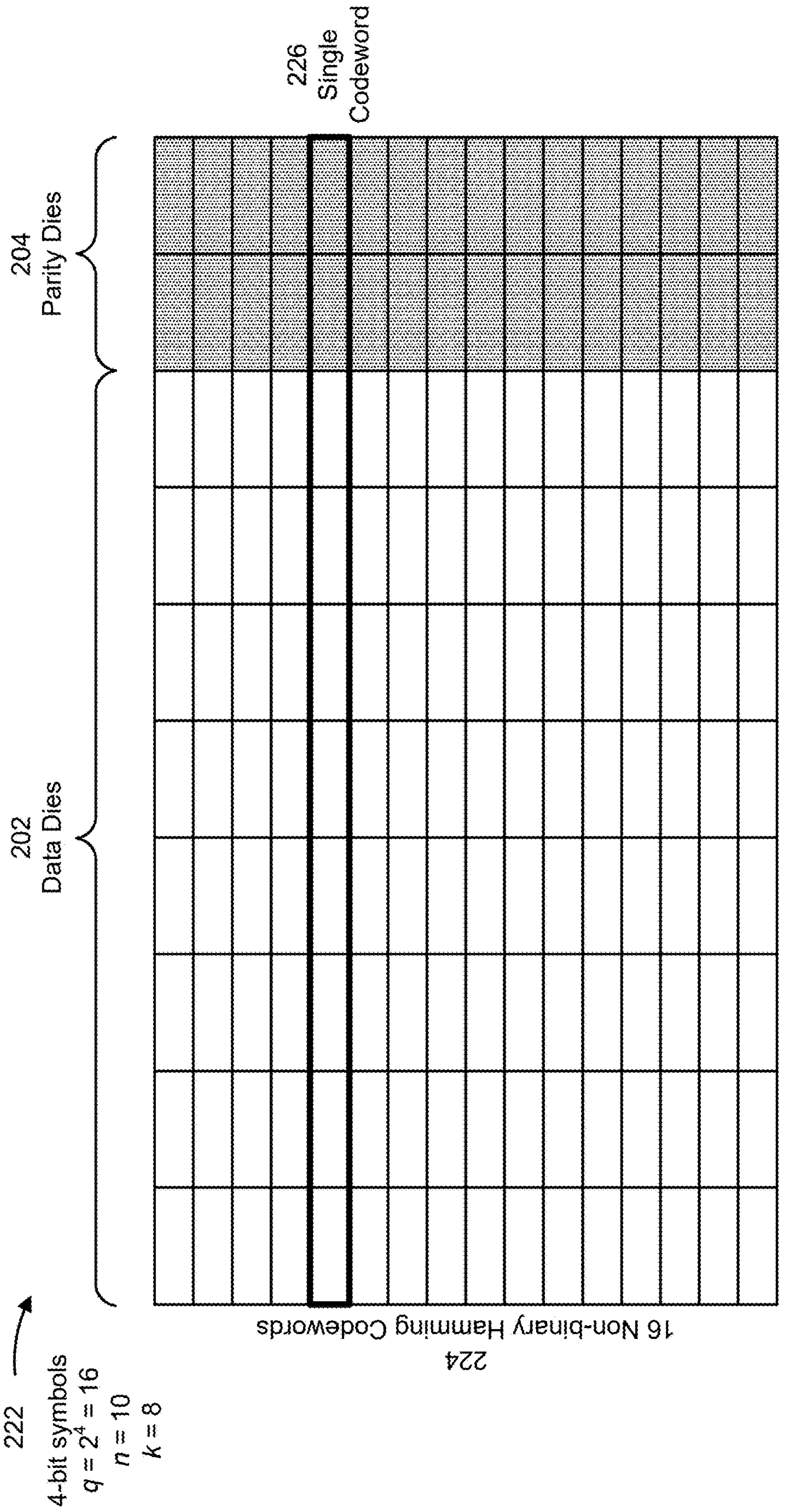

As shown in FIG. 2D, and as indicated by reference number 222, in some examples a chipkill protection scheme may use a non-binary Hamming code with 4-bit symbols. In such cases, a size of a symbol set (e.g., q) used in a non-binary Hamming coding scheme for the 40-bit memory stripe described above in connection with FIG. 2A may be equal to 16 (e.g., $2^4$), an effective length of a non-binary Hamming codeword used for the memory stripe (sometimes referred to herein as n) may be 10 symbols, and an effective dimension of the non-binary Hamming codeword (e.g., a length of a data portion of single non-binary Hamming codeword, sometimes referred to herein as k) may be 8 symbols. In such examples, as shown by reference numbers 224 and 226, 16 non-binary Hamming codewords may be used to provide chipkill protection for the 40-bit memory stripe described above in connection with FIG. 2A. Put another way, in examples implementing 4-bit symbols, there may be 16 non-binary Hamming codewords per memory stripe, with each codeword covering one beat of a data burst.

Figure 2E:
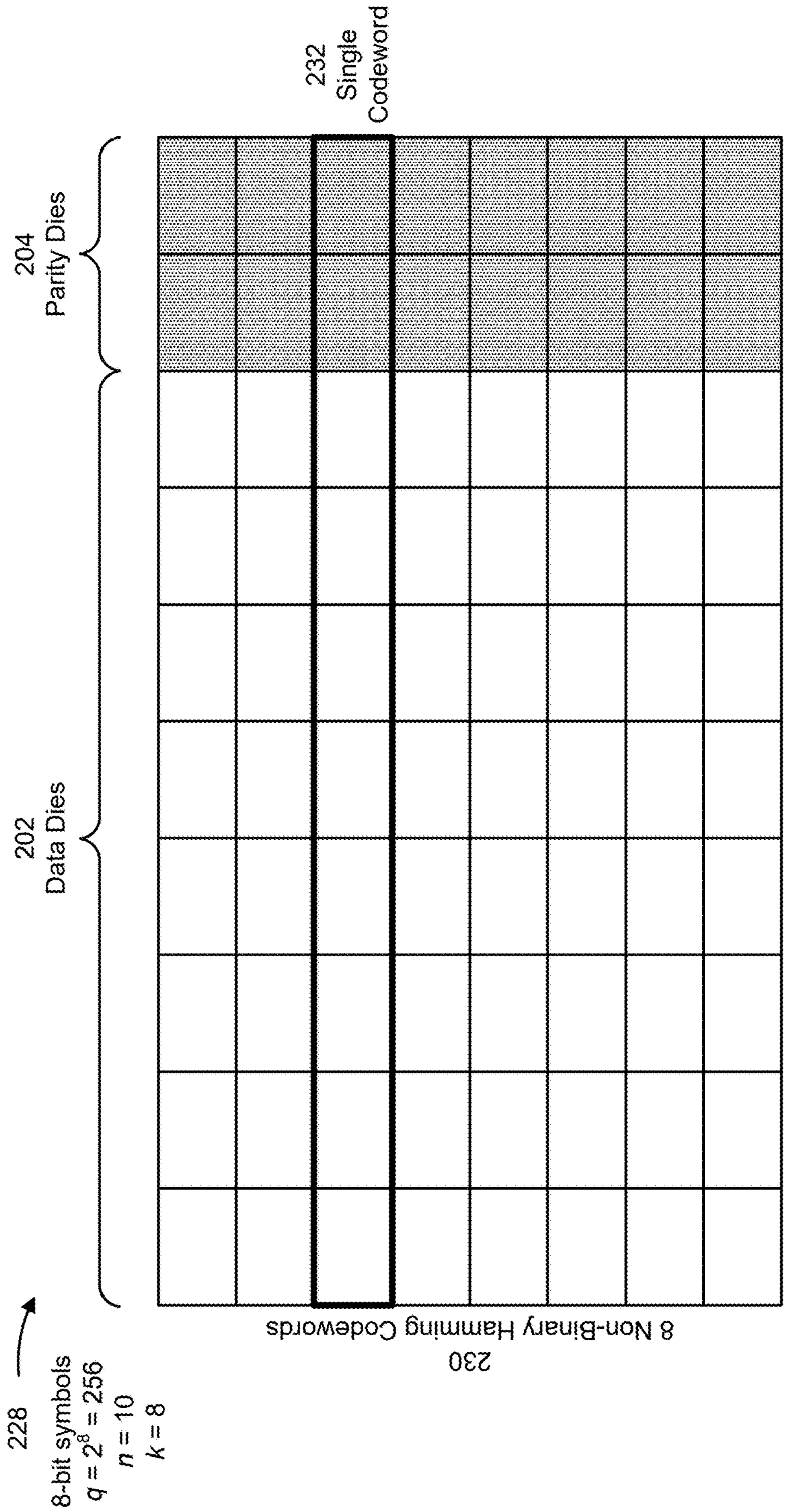

Similarly, as shown in FIG. 2E, and as indicated by reference number 228, in some examples a chipkill protection scheme may use a non-binary Hamming code with 8-bit symbols. In such cases, a size of a symbol set (e.g., q) used in a non-binary Hamming coding scheme for the 40-bit memory stripe described above in connection with FIG. 2A may be equal to 256 (e.g., $2^8$), an effective length of the non-binary Hamming codeword (e.g., n) may be 10 symbols, and an effective dimension of the non-binary Hamming codeword (e.g., k) may be 8 symbols. In such examples, as shown by reference number 230 and 232, 8 non-binary Hamming codewords may be used to provide chipkill protection for the 40-bit memory stripe described above in connection with FIG. 2A. Put another way, in examples implementing 8-bit symbols, there may be 8 non-binary Hamming codewords per memory stripe, with each codeword covering two beats of a data burst. In either case (e.g., a non-binary Hamming code with 4-bit symbols or a non-binary Hamming code with 8-bit symbols), each codeword contains no more than one symbol coming from each die. In that regard, because a non-binary Hamming decoder is capable of correcting up to one symbol in a codeword, the non-binary Hamming code chipkill protection scheme has the capability to correct all of the symbols coming from a single die (e.g., the failed die).

In some examples, chipkill protection schemes (such as the chipkill protection schemes described above in connection with FIGS. 2B-2D) may rely on full redundancy for error correction, and thus do not permit metadata bits to be inserted into a payload. "Metadata bits" refers to additional bits of information that may be included alongside the main data (e.g., the codeword) to provide extra context, control information, or error detection capabilities, among other information. In some examples, metadata bits do not form a part of the actual data being stored or transmitted, but instead serve to enhance functionality, reliability, and/or security of the memory system. In some instances, it may be beneficial to convey metadata bits along with a codeword, such as one or more CXL metadata bits (e.g., metadata bits that may be used for managing or optimizing data transfer over a CXL interface, which may contain information about the type of data, priority, and/or other control information relevant to the CXL protocol), a poison bit (e.g., a metadata bit that may be used to indicate that the data is erroneous and/or suspect, which may be set to indicate that an accompanying data block should not be used or trusted), a TEE bit (e.g., a metadata bit that may be used to indicate that the data is intended for or originated from the TEE and/or indicating that the data requires or has a certain level of security or confidentiality), among other types of metadata bits. Because the chipkill protection schemes described above rely on full redundancy and thus cannot support transmission of metadata bits, memory systems and/or memory devices employing chipkill protection schemes may be required to forgo transmission of metadata, resulting in decreased reliability of a memory system, corrupted data, and/or high power, computing, storage, and other resource consumption for identifying and correcting memory operation errors.

Some implementations described herein enable transmission of metadata bits with a codeword, thereby resulting in improved information flow and thus increased reliability of memory systems and thus decreased power, computing, storage, and other resource consumption otherwise required for identifying and correcting memory operation errors. In some implementations, metadata bits may be added to a codeword by shortening a data portion of a code, thereby enabling metadata to be encoded into the codeword without requiring storage of the metadata within a data portion of the memory stripe and/or without requiring transmission of the metadata bits in the channel. A decoder may perform parallel decoding of the codeword in order to identify a value of the metadata bits, such as by decoding the codeword using multiple hypotheses of the value of the metadata bits and/or by identifying which of the hypotheses results in a correctly decoded syndrome. As a result, metadata bits may be encoded within a codeword in a memory system, resulting in improved reliability and accuracy of data storage and transmission, reduction in data corruption incidents, enhanced system stability, enhanced data security and confidentiality, reduced latency in high-priority data processing, quick identification and isolation of corrupt data, and overall more efficient memory system operations.

As indicated above, FIGS. 2A-2E are provided as examples. Other examples may differ from what is described with regard to FIGS. 2A-2E.

FIGS. 3A-3F are diagrams of examples associated with encoding metadata information in a codeword. The operations described in connection with FIGS. 3A-3F may be performed by the memory system 110 and/or one or more components of the memory system 110, such as the memory system controller 115, one or more memory devices 120, and/or one or more local controllers 125.

Figure 3A:
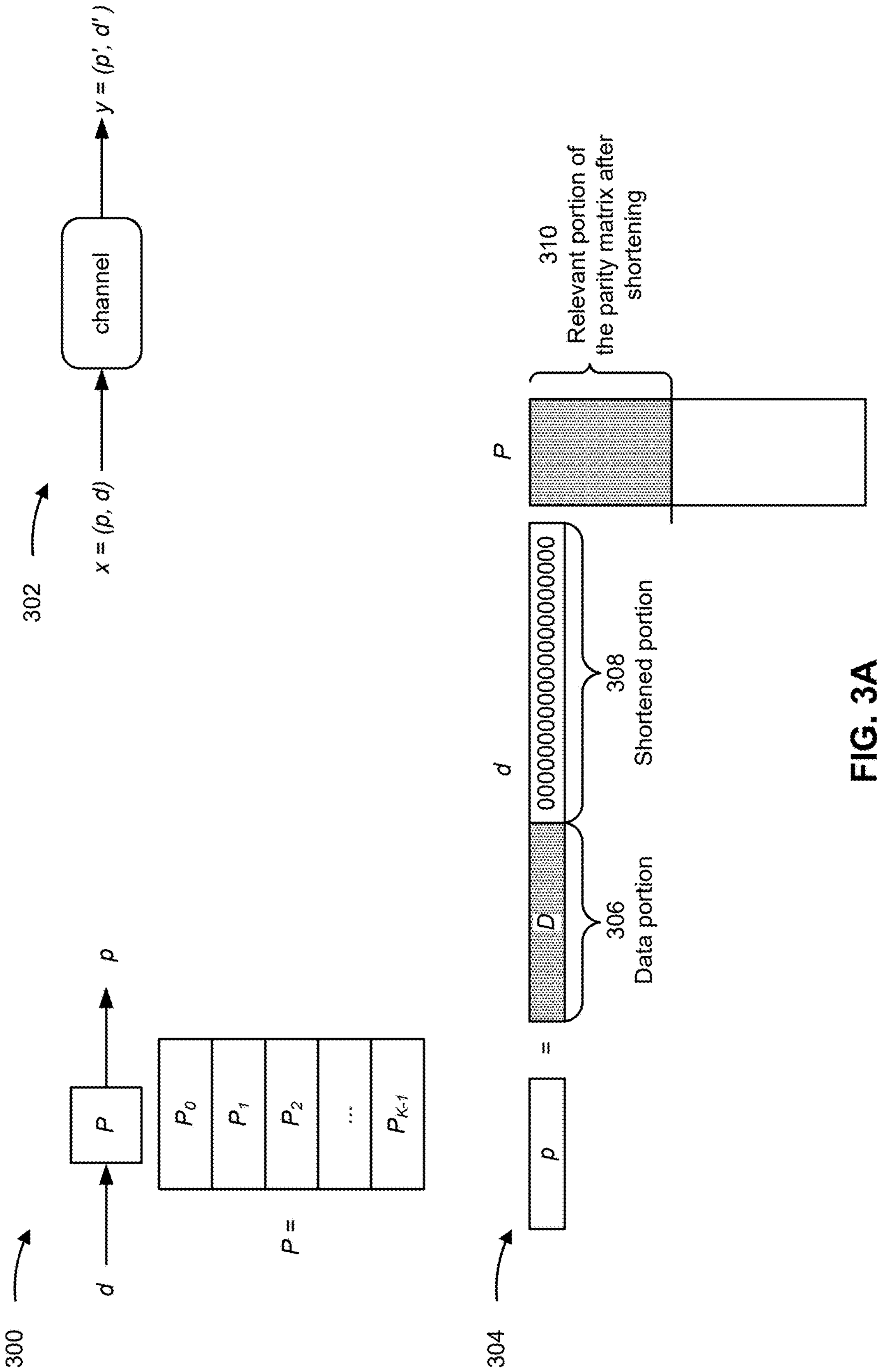
FIGS. 3A-3F are diagrams of examples associated with encoding metadata information in a codeword.

As shown in FIG. 3A, and as indicated by reference number 300, a linear code (e.g., an RS code, a non-binary Hamming code, and/or a similar code) may be encoded for transmission in a channel, such as a 40-bit channel as described above in connection with FIG. 2A. In such implementations, a parity of a systematic linear code may be given by the encoding equation p=dP, where p is the parity vector of length N−K, d is the data vector of length K, and P is the parity matrix of K rows and N−K columns. For ease of description, the parity matrix shown in FIG. 3A shows K rows indicated as $P_i$, with i being equal to 0, . . . , K−1. As indicated by reference number 302, a codeword (shown as x), which includes the parity vector (e.g., p) and the data vector (e.g., d), may be transmitted to a decoder through a channel, which may introduce noise such that the output of the channel may be different from the input of the channel. In that regard, the codeword transmitted in the channel may be represented as x=(p, d), and the codeword sensed at the decoder (shown as y), may be represented as y=(p', d').

As indicated by reference number 304, in some implementations a length of a data vector (e.g., d) may be shortened, such as for a purpose of reducing a length of a relevant portion of a parity matrix (e.g., P) associated with the codeword. Shortening may include zeroing certain positions in the data vector (sometimes referred to herein as shortened positions within the data vector and/or a shortened portion of the data vector) before encoding the data vector. For example, as shown in connection with reference number 304, the data vector (e.g., d) may include a data portion (represented as D and indicated by reference number 306), which may include data, and a shortened portion (indicated by reference number 308), which may be a portion of the data vector in which all positions are set to zero. In this regard, because the shortened portion of the data vector is set to zero, only a portion of the parity matrix (e.g., P) is relevant for purposes of encoding the parity vector (e.g., p), as indicated by reference number 310. Put another way, only a portion of the parity matrix that is multiplied by the data portion (e.g., D) of the parity matrix is relevant for purposes of encoding the parity vector (e.g., p), because the remaining portion of the parity matrix will be multiplied by zero.

In some implementations, a shortened code (e.g., a shortened data portion, D, of a data vector, d) may be exploited in order to convey additional bits to a decoder, such as metadata bits or similar bits, without actually transmitting the metadata bits in the channel. For example, in a chipkill protection scheme implementing 8-bit symbol non-binary Hamming codes, a length of a primitive code (e.g., a total number of symbol positions in the original, unmodified non-binary Hamming code) may be $$N = \frac{q^r - 1}{q - 1}.$$

In implementations in which r=2, $$N = \frac{q^r - 1}{q - 1} = \frac{q^2 - 1}{q - 1} = \frac{(q+1)(q-1)}{q - 1} = q + 1,$$

and, because q is equal to 256 (e.g., $2^8$), N=257. Moreover, the primitive dimension (e.g., the number of information symbols in the primitive non-binary Hamming code) may be K=N−r, which is equal to 257−2 or 255. Similarly, in a chipkill protection scheme implementing 4-bit symbol non-binary Hamming codes, a length of a primitive code (e.g., a total number of symbol positions in the original, unmodified non-binary Hamming code) may be 17 (e.g., N=q+1=16+1), and a primitive dimension may be K=N−r, which is equal to 17−2 or 15. As described above in connection with FIGS. 2D and 2E, an effective length needed for chipkill protection of a 40-bit memory may be n=10, and an effective dimension needed for chipkill protection of a 40-bit memory may be k=8. In such implementations, the code used to transmit the information may be shortened, because only 8 out of 15 available data positions in 4-bit implementations, or 8 out of 255 data positions in 8-bit implementations, are needed to convey the data stored in the memory stripe. Accordingly, in some implementations, a metadata bit may be stored per codeword without adding any additional cells to the memory stripe, thereby enabling indication of up to eight metadata bits per memory stripe in 8-bit symbol implementations (because there are eight codewords per memory stripe, as described above in connection with FIG. 2E) or up to sixteen metadata bits per memory stripe in 4-bit symbol implementations (because there are sixteen codewords per memory stripe, as described above in connection with FIG. 2D). In some other implementations, more than one metadata bit may be indicated per codeword, such as by increasing a complexity of a decoding component, which is described in more detail below.

Figure 3B:
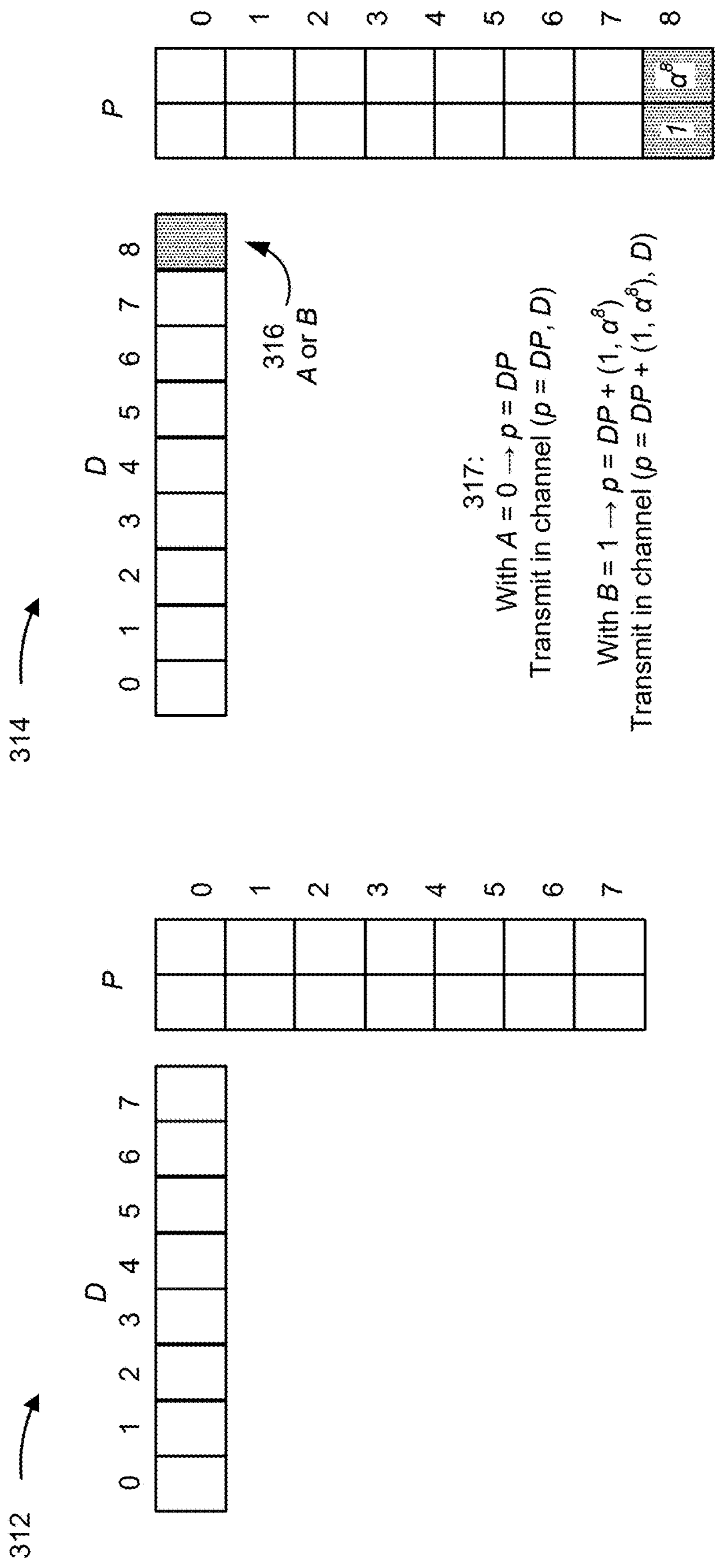

This may be more readily understood with reference to FIG. 3B. As shown in FIG. 3B, and as indicated by reference number 312, in some implementations a data portion (e.g., D) of a shortened code may need to be capable of transmitting eight symbols of data (indexed as 0 through 7), such as when an ECC is associated with 4-bit or 8-bit non-binary Hamming codes and/or the 40-bit memory. In such implementations, a relevant portion of the parity matrix, P, may include eight rows (indexed as 0 through 7 in the example shown in connection with reference number 312). However, the decoder may have a capability of decoding more than eight data symbols using parity bits (e.g., the data symbols, D, may be a shortened portion of the non-binary Hamming code). For example, for a 4-bit symbol non-binary Hamming code, a decoder may have a capability of decoding up to 15 data symbols (e.g., K=15), but only eight symbols may be needed to transmit the data (e.g., D=8). In that regard, a remaining portion of the data vector may be shortened, such as by setting the positions to zero, as described above in connection with reference number 304 in FIG. 3A. As another example, for an 8-bit symbol non-binary Hamming code, a decoder may have a capability of decoding up to 255 data symbols (e.g., K=255), but only eight symbols are needed to transmit the data. In that regard, a remaining portion of the data vector may be shortened, such as by setting the positions to zero, as described above in connection with reference number 304 in FIG. 3A.

For certain error correction codes and/or memory stripes (e.g., the 4-bit or 8-bit non-binary Hamming codes used in connection with 40-bit memory stripes, as described above), there is at least one additional symbol of the data vector, d, that may be used for a purpose of transmitting metadata information. Put another way, in some implementations the parity vector (e.g., p) may be capable of providing error correction for up to a first quantity of bits (e.g., K), and a data vector (e.g., d) associated with a codeword may be associated with a second quantity of data bits (e.g., k) and/or a third quantity of zero bits (e.g., K−k) such that the second quantity is less than the first quantity (e.g., k<K). In such implementations, such as the example shown in connection with reference number 314, an additional bit (e.g., a metadata bit) may be encoded into the codeword. More particularly, as indicated by reference number 316, in this example a ninth symbol (indexed as symbol 8, which is shown using stippling in FIG. 3B, and which is sometimes referred to herein as $D_8$) may be used to convey metadata information, and a corresponding ninth row of the parity matrix may be used to create parity bits in the parity vector (e.g., p) associated with the metadata symbol. For example, $D_8$ may be used to transmit one of A or B, where A and B are elements of a Galois field with dimension $2^m$, where m is the number of metadata bits to be conveyed by the symbol (e.g., A, B $\in GF(2^m)$). In that regard, a certain value (e.g., one of A or B) may be selected to convey a first value of a metadata bit (sometimes referred to herein as F), and another value (e.g., the other one of A or B) may be selected to convey a second value of a metadata bit. For example, in the case in which one metadata bit per codeword is to be transmitted, if F=0, $D_8$ may be set to A, and if F=1, $D_8$ may be set to B.

In this regard, a parity vector, computed as dP, may be equal to DP+A(1, $\alpha^8$) when the ninth symbol is set to A, and the parity vector may be equal to DP+B(1, $\alpha^8$) when the ninth symbol is set to B. Accordingly, and as indicated by reference number 317, with A=0, the parity vector (e.g., p) becomes DP, and thus the codeword transmitted in the channel (e.g., x), which is equal to (p, d) as described above, becomes (DP, D). Similarly, with B=1, the parity vector (e.g., p) becomes DP+(1, $\alpha^8$), and thus the codeword transmitted in the channel (e.g., x) becomes (DP+(1, $\alpha^8$), D).

Accordingly, a decoder may be capable of identifying the value of a metadata bit (e.g., F) by decoding the vector (p, D). More particularly, the decoder may receive the potentially corrupted vector (p, D) (e.g., the decoder may receive (p', D'), in a similar manner as described above in connection with reference number 302 of FIG. 3A). In this example, the ninth symbol of the data vector (e.g., $D_8$) is not transmitted in the channel, and thus the decoder does not know the value of the metadata bit (e.g., F) explicitly. Instead, the received vector (p, D) will include two symbols of parity (e.g., p) and eight symbols of data (e.g., D). Using the two symbols of parity and eight symbols of data, the decoder may be capable of detecting the value of the metadata bit (e.g., F) and may be capable of correcting single symbol errors, if necessary. In such implementations, the decoder may do so by performing in-parallel decoding of the received vector using two hypotheses: a first hypothesis in which the value of the metadata bit (e.g., F) is zero and a second hypothesis in which the value of the metadata bit is one. Put another way, the decoder may assume in a first hypothesis that $D_8$=A=0, and the decoder may assume in a second hypothesis that $D_8$=B=1. By decoding the vector using two different hypotheses, the decoder will arrive at two different decoded sets of bits and/or syndromes, sometimes referred to herein as $S_{H0}$ corresponding to a syndrome associated with a first hypothesis (e.g., F=0) and $S_{H1}$ corresponding to a syndrome associated with a second hypothesis (e.g., F=1). In that regard, $S_{H0}$ may be equal to p+DP, and $S_{H1}$ may be equal to p+DP+(1, $\alpha^8$) Put another way, $S_{H1}=S_{H0}+(1, \alpha^8)$ (e.g., $S_{H1} \neq S_{H0}$).

In connection with decoding the received codeword and/or determining the two syndromes, the decoder may determine any detected errors associated with the codeword (and, more particularly, associated with the data portion, D, of the codeword). For example, for a given syndrome and/or hypothesis, the decoder may determine that that there are no detected errors (sometimes referred to herein as an outcome of zero errors (0E)), that there is a detected correctable error (CE), and/or that there is a detected uncorrectable error (UE). Additionally, or alternatively, a correctable error (e.g., CE) may be determined to be one of an error in which the error position is in one of symbols 0 through 7 (sometimes referred to herein as $D_0$ through $D_7$), which is sometimes referred to herein as CE07, or else an error in which the error position is in symbol 8 (e.g., $D_8$), which is sometimes referred to herein as CE8. In that regard, following the parallel decoding (e.g., decoding of the received vector based on the two hypotheses H0 and H1), the decoder will arrive at two sets of results, one associated with the first hypothesis (sometimes referred to herein as $\{0E, CE07, CE8, UE\}_{H0}$) and one associated with the second hypothesis (sometimes referred to herein as $\{0E, CE07, CE8, UE\}_{H1}$). Using the results of the decoding processes (e.g., $\{0E, CE07, CE8, UE\}_{H0}$) and $\{0E, CE07, CE8, UE\}_{H1}$), the decoder may detect the value of the metadata bit (e.g., F) and may correct any errors, if necessary. Put another way, using the results of the parallel decoding processes, the decoder may identify a correct hypothesis as well as correct any errors in the received codeword.

Figure 3C:
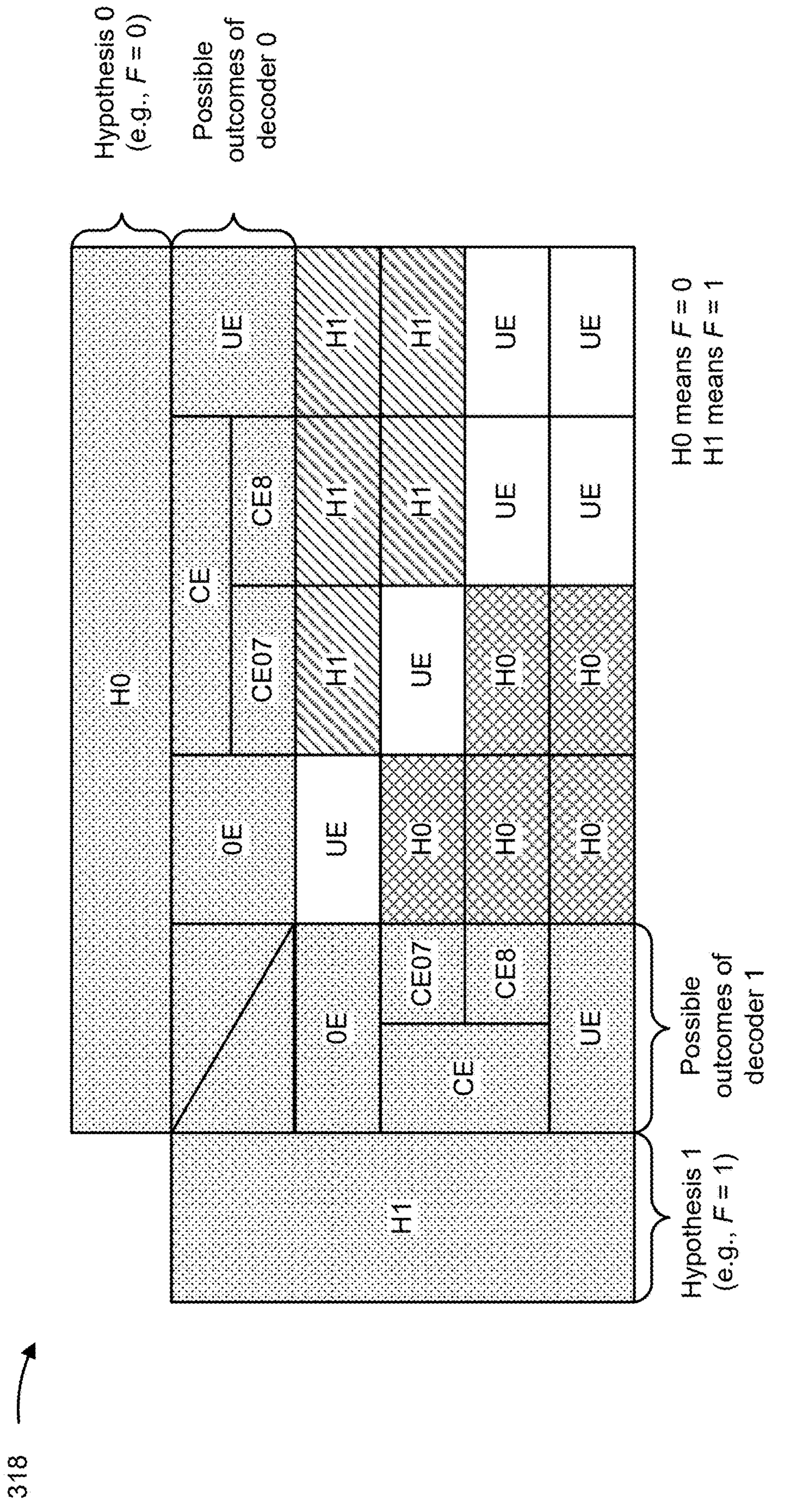

For example, FIG. 3C shows one example of a decoding table (indicated by reference number 318) that may be used by a decoder to determine a correct hypothesis using two results of parallel decoding processes (e.g., using $\{0E, CE07, CE8, UE\}_{H0}$) and $\{0E, CE07, CE8, UE\}_{H1}$). As shown in FIG. 3C, a decoder may decode the codeword using a first hypothesis (e.g., H0) that is associated with a first hypothesized value of the metadata bit (e.g., F=0) and may decode the codeword using a second hypothesis (e.g., H1) that is associated with a second hypothesized value of the metadata bit (e.g., F=1), arriving at two different decoded sets of bits (e.g., two different syndromes). In such implementations, the possible outcomes of each decoding process may be zero detected errors (e.g., 0E), a correctable error detected in one of the first eight symbols of the data vector (e.g., CE07), a correctable error detected in the ninth symbol of the data vector (e.g., CE8), or a detected uncorrectable error. In some implementations, the decoder may determine which hypothesis is a correct hypothesis by identifying a cell in the decoding table that corresponds to the results of the parallel decoding processes.

In some examples, the results of the two parallel decoding processes may not result in an indication of the correct hypothesis (e.g., an indication of the correct hypothesis), which is shown as an uncorrectable error (e.g., UE) in the decoding table. For example, if both decoding processes identify zero errors (e.g., 0E), the parallel decoding processes may be incapable of identifying a correct hypothesis. Moreover, if both decoding processes identify a correctable error in the first through eighth symbols (e.g., CE07), if both decoding processes identify a correctable error in the ninth symbol (e.g., CE8), or if both decoding processes identify an uncorrectable error (e.g., UE), the parallel decoding processes may be incapable of identifying a correct hypothesis. Furthermore, if one of the decoding processes identifies a correctable error in the ninth symbol (e.g., CE8) and the other one of the decoding processes identifies an uncorrectable error (e.g., UE), the parallel decoding processes may be incapable of identifying a correct hypothesis.

However, in some cases, the results of the two parallel decoding processes may indicate the correct hypothesis, which is shown as one of "H0" in the decoding table (meaning that the first hypothesis is the correct hypothesis) or "H1" in the decoding table (meaning that the second hypothesis is the correct hypothesis). For example, if the first decoding process (e.g., the decoding process that utilizes H0) identifies zero errors (e.g., 0E) and the second decoding process (e.g., the decoding process that utilizes H1) identifies a correctable error (e.g., one of CE07 or CE8) or an uncorrectable error (e.g., UE), the parallel decoding processes may indicate that the first hypothesis (e.g., H0) is the correct hypothesis. Similarly, if the second decoding process identifies zero errors (e.g., 0E) and the first decoding process identifies a correctable error (e.g., one of CE07 or CE8) or an uncorrectable error (e.g., UE), the parallel decoding processes may indicate that the second hypothesis (e.g., H1) is the correct hypothesis. Moreover, if the first decoding process identifies a correctable error in one of the first eight data vector symbols (e.g., CE07) and the second decoding process identifies one of a correctable error in the ninth data vector symbol (e.g., CE8) or an uncorrectable error (e.g., UE), the parallel decoding processes may indicate that the first hypothesis (e.g., H0) is the correct hypothesis. Similarly, if the second decoding process identifies a correctable error in one of the first eight data vector symbols (e.g., CE07) and the first decoding process identifies one of a correctable error in the ninth data vector symbol (e.g., CE8) or an uncorrectable error (e.g., UE), the parallel decoding processes may indicate that the second hypothesis (e.g., H1) is the correct hypothesis.

Figure 3D:
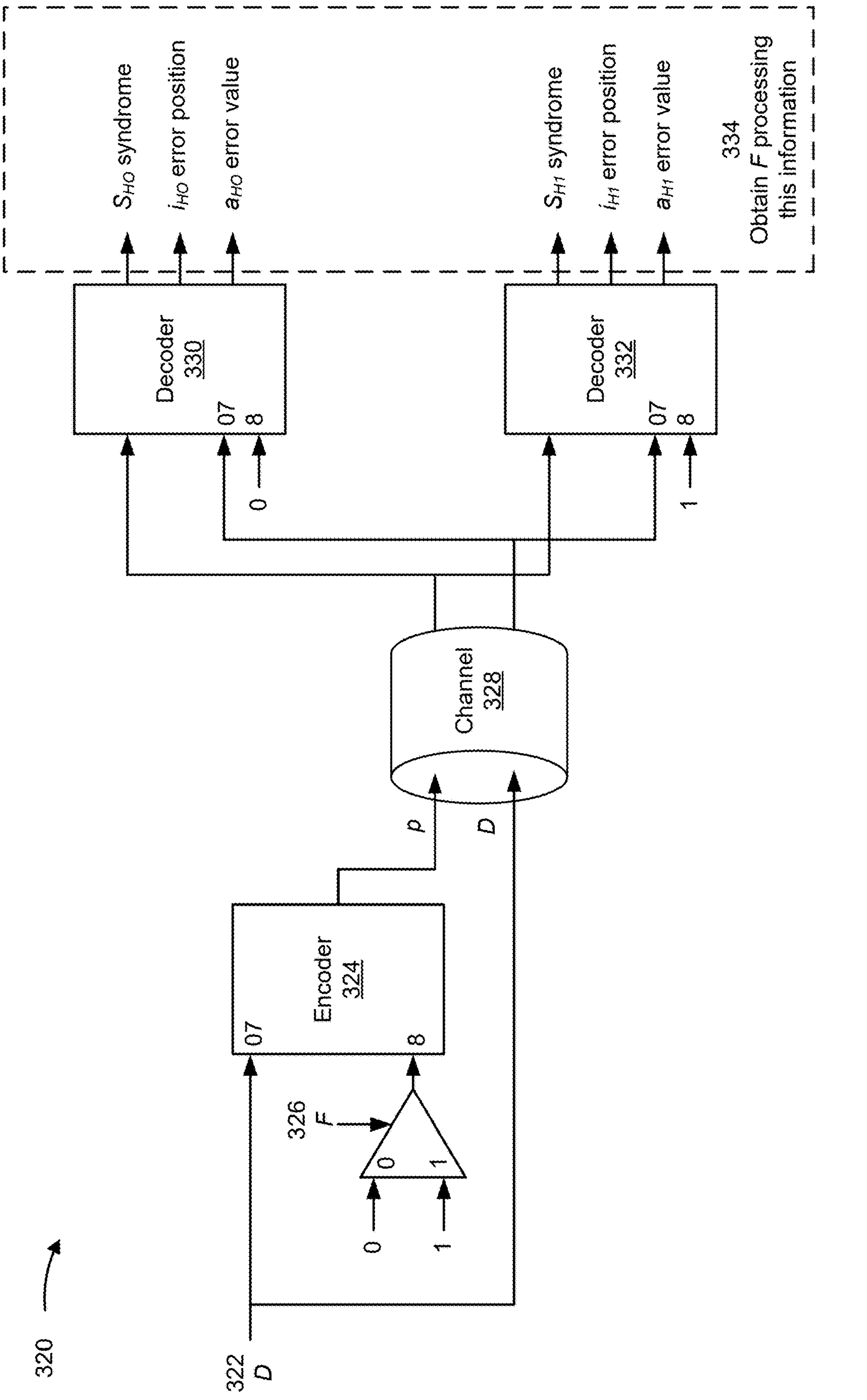

FIG. 3D shows an example functional block diagram 320 associated with utilizing a parallel decoding process to identify a value of metadata that is not explicitly stored in a memory stripe and/or that is not expressly transmitted in a data channel. As indicated by reference number 322, a data vector (e.g., D) may be provided to an encoder 324, such as a non-binary Hamming encoder or a similar encoder. In some implementations, the data vector may be associated with a shortened code. For example, for the 40-bit memory described above in connection with FIG. 2A, the data vector may be associated with eight symbols, indexed as 0 through 7 and shown in connection with the encoder 324 as "07." In implementations in which a 4-bit non-binary Hamming code is utilized, this may represent a shortened code because only eight out of fifteen available data vector symbols are being used to transmit data. Similarly, in implementations in which an 8-bit non-binary Hamming code is utilized, this may represent a shortened code because only eight out of 255 available data vector symbols are being used to transmit data. Moreover, as indicated by reference number 326, one or more metadata bits may be indicated to the encoder 324. For example, in implementations in which one metadata bit is to be conveyed to the decoder, a value of the metadata bit (e.g., F) may be one of 0 or 1, as described above. The metadata bit may be associated with one symbol of the data vector (e.g., d), such as the ninth symbol (indexed as symbol 8) in the example associated with the 40-bit memory described above in connection with FIG. 2A. In this way, the encoder may encode a parity vector (e.g., p) using a parity matrix (e.g., P), the shortened data vector (e.g., D), and the value of the one or more metadata bits (e.g., F). Put another way, a memory device and/or a memory system associated with the example functional block diagram 320 may encode a codeword that encodes multiple data bits associated with a portion of memory (e.g., D), multiple parity bits associated with error correction of the multiple data bits (e.g., p), and at least one metadata bit (e.g., F).

The parity vector (e.g., p) and the shortened data vector (e.g., D) may be conveyed to one or more decoding components via a channel 328. For example, in examples associated with the 40-bit memory described above in connection with FIG. 2A, a codeword associated with the shortened data vector and the parity vector (which is based on the shortened data vector and the one or more metadata bits, as described above) may be transmitted to one or more decoding components via a 40-bit channel. The codeword, via the channel 328, may be provided to a first decoder 330 and a second decoder 332. Put another way, each decoder 330, 332 that is to perform a parallel decoding process may receive a codeword that encodes a data vector (e.g., D), a parity vector (e.g., p) associated with error correction of the data vector, and a metadata bit (e.g., F). Although for ease of description the first decoder 330 and the second decoder 332 are shown as separate decoders, in some examples the two decoders 330. 332 may share common terms and/or components. Moreover, although for ease of description the encoder 324, the first decoder 330, and the second decoder 332 are shown as separate components, in some implementations the encoder 324, the first decoder 330, and/or the second decoder 332 may be associated with a common component, such as an error correction code (ECC) engine or a similar component. Put another way, a memory system and/or a memory device may be associated with an ECC engine, with the ECC engine including the encoder 324, the first decoder 330 (e.g., a decoder configured to perform a decoding procedure associated with the first hypothesis (e.g., H0)), and the second decoder 332 (e.g., a decoder configured to perform a second decoding procedure associated with the first hypothesis (e.g., H1)).

Upon receiving the codeword, the first decoder 330 may decode the codeword by using the first hypothesis (H0) (e.g., by assuming that one or more metadata bits are a first value, such as F=0), arriving at a first syndrome ($S_{H0}$) (e.g., a first decoded set of bits), a first error position ($i_{H0}$) (e.g., $i \in [0,7]$ corresponding to CE07 or i=8 corresponding to CE8), and/or a first error value ($a_{H0}$). Similarly, the second decoder 332 may decode the codeword by using the second hypothesis (H1) (e.g., by assuming that one or more metadata bits are a second value, such as F=1), arriving at a second syndrome ($S_{H1}$) (e.g., a second decoded set of bits), a second error position ($i_{H1}$), and/or a second error value ($a_{H1}$). Put another way, the memory system and/or the memory device may determine a position in the data vector (e.g., D) associated with a first symbol error associated with the first syndrome (e.g., $S_{H0}$) and/or a second symbol error associated with the second syndrome (e.g., $S_{H1}$). As indicated by reference number 334, the decoders 330, 332 and/or a memory system and/or memory device associated with the decoders 330, 332 may determine a value of the one or more metadata bits (e.g., F) based on the decoded results, such as by using the decoding table described above in connection with FIG. 3C.

Put another way, the memory system and/or the memory device may determine a value of the metadata bit by performing a first decoding procedure to determine a first syndrome ($S_{H0}$) (with the first decoding procedure being based on using a first hypothesized value of the metadata bit (e.g., F=0)), performing a second decoding procedure to determine a second syndrome ($S_{H1}$) (with the second decoding procedure being based on using a second hypothesized value of the metadata bit (e.g., F=1)), and selecting, using the first syndrome and the second syndrome, one of the first hypothesized value of the metadata bit or the second hypothesized value of the metadata bit as the value of the metadata bit. Additionally, or alternatively, the memory system may determine at least one of a first symbol error associated with the first syndrome (e.g., $i_{H0}$ and/or $a_{H0}$) or a second symbol error associated with the second syndrome (e.g., $i_{H1}$ and/or $a_{H1}$), and/or may select the one of the first hypothesized value of the metadata bit or the second hypothesized value of the metadata bit as the value of the metadata bit by using the at least one of the first symbol error associated with the first syndrome or the second symbol error associated with the second syndrome (e.g., by using the decoding table described above in connection with FIG. 3C).

Although two decoders 330, 332 are shown as described in connection with identifying a single metadata bit, in some other implementations additional decoders may be used. For example, in implementations in which multiple metadata bits, m, are encoded in the codeword, a quantity of hypotheses to consider will be $2^m$, and thus $2^m$ decoders may be used. Moreover, once a correct syndrome and/or hypothesis is identified, the memory system and/or memory device may perform additional operations associated with the correct hypothesis and/or syndrome, such as correcting a symbol error associated with the correct syndrome and/or hypothesis.

In some implementations, decoding results from multiple ECC engines, with each engine including an encoder component (e.g., encoder 324) and/or one or more decoder components (e.g., decoder 330 and/or decoder 332), may be used for a purpose of identifying a correct hypothesis and/or a value of one or more metadata bits. For example, in some implementations a memory device and/or a memory system may select one of the first hypothesized value of the metadata bit (e.g., 0) or the second hypothesized value of the metadata bit (e.g., 1) as the value of the metadata bit (e.g., F) based on the first syndrome (e.g., $S_{H0}$), the second syndrome (e.g., $S_{H1}$), and syndromes determined by one or more ECC engines, of multiple error correction code engines associated with a memory stripe and/or portion of memory.

Figure 3E:
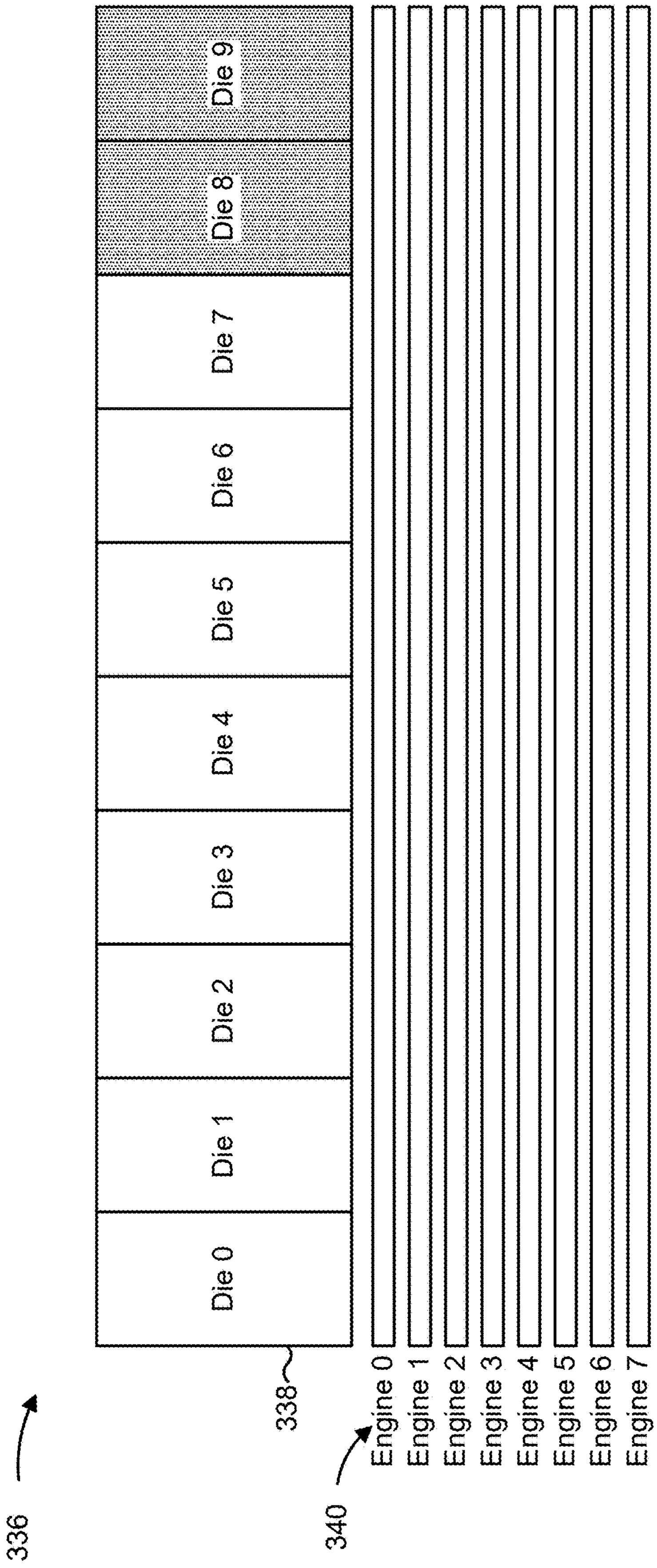
Figure 3F:
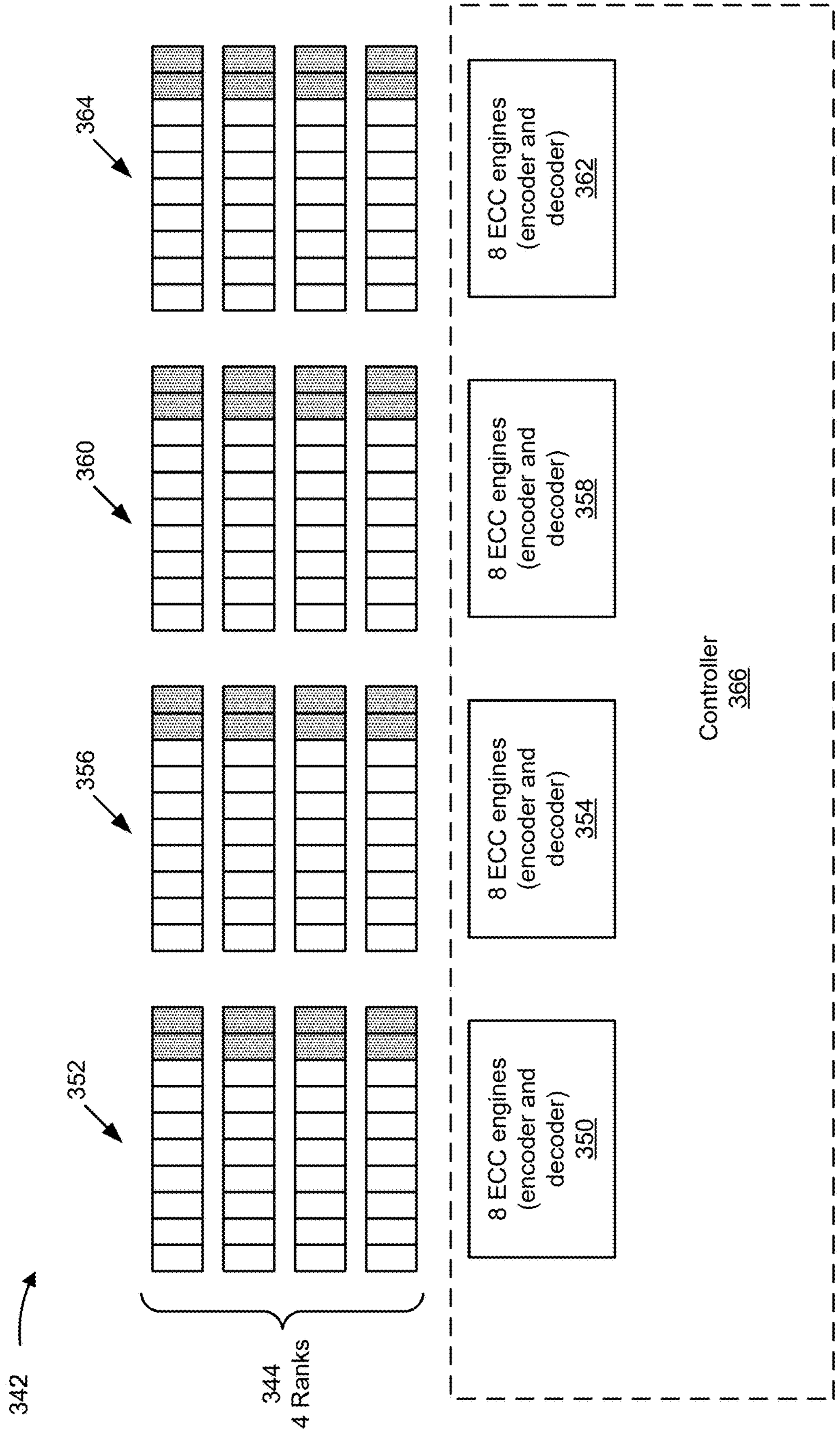

For example, as shown in FIGS. 3E and 3F, a memory device and/or memory system may be associated with multiple ECC engines. More particularly, in the example implementation 336 shown in FIG. 3E, a memory stripe 338 may be associated with ten dies (e.g., eight data dies and two parity dies), and thus may correspond to the 40-bit memory described above in connection with FIG. 2A. In implementations in which 8-bit symbol non-binary Hamming codes are used, there may be eight codewords in the memory stripe 338 (as described above in connection with FIG. 2E). Accordingly, as shown by reference number 340, the memory device and/or memory system may include eight ECC engines, indexed in FIG. 3E as Engine 0 through Engine 7. Each ECC engine may be associated with a corresponding codeword in the memory stripe 338, such that each engine is capable of encoding one or more metadata bits in the corresponding codeword and/or performing parallel decoding to identify the one or more metadata bits, such as described above in connection with FIG. 3D. In some other implementations more or fewer ECC engines may be associated with a memory stripe. For example, in examples involving 4-bit non-binary Hamming codes, such as the example described above in connection with FIG. 2D, there may be sixteen Hamming codewords per memory stripe and thus sixteen ECC engines per 40-bit channel.

Similarly, in the example implementation 342 shown in FIG. 3F, a memory system and/or a memory device may be associated with multiple memory stripes, and groups of one or more memory stripes may be associated with multiple ECC engines. For example, as indicated by reference number 344, a memory system and/or memory device may be a multi-rank memory system and/or memory device, such as a four-rank memory system and/or memory device as shown in FIG. 3F. In such implementations, each group of four memory stripes may be associated with a corresponding set of ECC engines. For example, in implementations in which 8-bit symbol non-binary Hamming codes are used, the memory device and/or memory system may include eight ECC engines for each group of memory stripes. More particularly, a first set of ECC engines 350 may perform encoding and/or parallel decoding for a first group of memory stripes 352, a second set of ECC engines 354 may perform encoding and/or parallel decoding for a second group of memory stripes 356, a third set of ECC engines 358 may perform encoding and/or parallel decoding for a third group of memory stripes 360, a fourth set of ECC engines 362 may perform encoding and/or parallel decoding for a fourth group of memory stripes 364, and so forth. The sets of ECC engines 350, 354, 358, 362 may be controlled by, included in, and/or otherwise associated with a central controller 366 (e.g., memory system controller 115 and/or local controller 125).

In such implementations, results from multiple ECC engines (e.g., Engine 0 through Engine 7, as indicated by reference number 340 in FIG. 3E) and/or results from multiple sets of ECC engines (e.g., sets of ECC engines 350, 354, 358, 362 shown in FIG. 3F) may be used to identify a correct hypothesis for a given memory stripe and/or one or more metadata bits associated with a given memory stripe. For example, a given ECC engine may determine two syndromes as a result of a parallel decoding process, with a first syndrome indicating a correctable error (e.g., CE07) in a first die and a second syndrome indicating a correctable error (e.g., CE07) in a second die. If other ECC engines associated with the same memory stripe (e.g., ECC engines used to decode other codewords in the same memory stripe) identify a correctable error in the first die, this may be indicative that the first die has failed. Thus, the memory device may determine that the first hypothesis is the correct hypothesis, because the first hypothesis identified an error in the failed die while the second hypothesis did not identify an error in the failed die.

As indicated above, FIGS. 3A-3F are provided as examples. Other examples may differ from what is described with regard to FIGS. 3A-3G.

Figure 4:
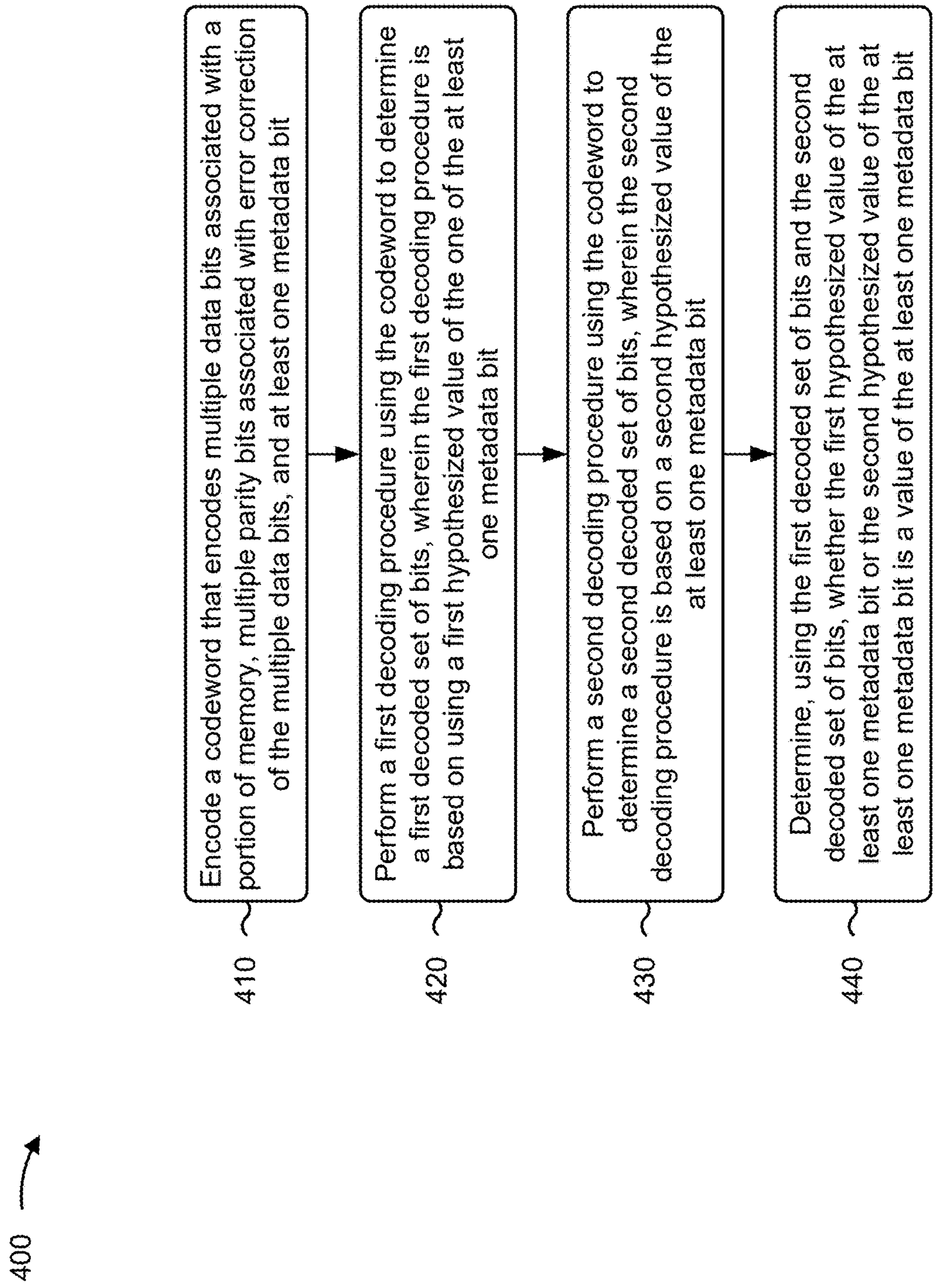
FIG. 4 is a flowchart of an example method associated with encoding metadata information in a codeword.

FIG. 4 is a flowchart of an example method 400 associated with encoding metadata information in a codeword. In some implementations, an ECC engine (e.g., one of the ECC engines described above in connection with 340 and/or an ECC engine including an encoder component (e.g., encoder 324) and/or one or more decoder components (e.g., decoder 330, 332)) may perform or may be configured to perform the method 400. In some implementations, another device or a group of devices separate from or including the ECC engine (e.g., memory system controller 115, local controller 125, encoder 324, first decoder 330, second decoder 332, one or more of the ECC engines described in connection with reference number 340, one or more sets of ECC engines 350, 354, 358, 362, and/or controller 366) may perform or may be configured to perform the method 400. Additionally, or alternatively, one or more components of the ECC engine (e.g., memory system controller 115, local controller 125, encoder 324, first decoder 330, second decoder 332, one or more of the ECC engines described in connection with reference number 340, one or more sets of ECC engines 350, 354, 358, 362, and/or controller 366) may perform or may be configured to perform the method 400. Thus, means for performing the method 400 may include the ECC engine and/or one or more components of the ECC engine. Additionally, or alternatively, a non-transitory computer-readable medium may store one or more instructions that, when executed by the ECC engine, cause the ECC engine to perform the method 400.

As shown in FIG. 4, the method 400 may include encoding a codeword that encodes multiple data bits associated with a portion of memory (e.g., a data vector, such as D), multiple parity bits associated with error correction of the multiple data bits (e.g., a parity vector, such as p), and at least one metadata bit (e.g., F) (block 410). As further shown in FIG. 4, the method 400 may include performing a first decoding procedure using the codeword to determine a first decoded set of bits (e.g., a first syndrome, such as $S_{H0}$), wherein the first decoding procedure is based on using a first hypothesized value of the at least one metadata bit (e.g., 0 and/or H0) (block 420). As further shown in FIG. 4, the method 400 may include performing a second decoding procedure using the codeword to determine a second decoded set of bits (e.g., a second syndrome, such as $S_{H1}$), wherein the second decoding procedure is based on using a second hypothesized value of the at least one metadata bit (e.g., 1 and/or H1) (block 430). As further shown in FIG. 4, the method 400 may include determining, using the first decoded set of bits and the second decoded set of bits, whether the first hypothesized value of the at least one metadata bit or the second hypothesized value of the at least one metadata bit is a value of the at least one metadata bit (e.g., F) (block 440).

The method 400 may include additional aspects, such as any single aspect or any combination of aspects described below and/or described in connection with one or more other methods or operations described elsewhere herein.

In a first aspect, the multiple parity bits are capable of providing error correction for up to a first quantity of bits (e.g., Kbits), wherein the multiple data bits are associated with a data portion (e.g., D) and a shortened portion (e.g., a portion of d set to zero), wherein the data portion is associated with a second quantity of bits (e.g., k), and wherein the second quantity of data bits is less than the first quantity of bits (e.g., k<K).

In a second aspect, alone or in combination with the first aspect, the method 400 includes determining at least one of a first symbol error associated with the first decoded set of bits (e.g., $i_{H0}$ and/or $a_{H0}$) or a second symbol error associated with the second decoded set of bits (e.g., $i_{H1}$ and/or $a_{H1}$), wherein determining whether the first hypothesized value of the at least one metadata bit or the second hypothesized value of the at least one metadata bit is the value of the at least one metadata bit comprises using the at least one of the first symbol error associated with the first decoded set of bits or the second symbol error associated with the second decoded set of bits.

In a third aspect, alone or in combination with one or more of the first and second aspects, the method 400 includes correcting one of the first symbol error associated with the first decoded set of bits or the second symbol error associated with the second decoded set of bits based on determining whether the first hypothesized value of the at least one metadata bit or the second hypothesized value of the at least one metadata bit is the value of the at least one metadata bit.

In a fourth aspect, alone or in combination with one or more of the first through third aspects, the method 400 includes determining a position in the multiple data bits associated with the at least one of the first symbol error associated with the first decoded set of bits (e.g., $i_{H0}$) or the second symbol error associated with the second decoded set of bits (e.g., $i_{H1}$).

In a fifth aspect, alone or in combination with one or more of the first through fourth aspects, the value of the metadata bit is one of 0 or 1, wherein the first hypothesized value of the metadata bit is 0, and wherein the second hypothesized value of the metadata bit is 1.

In a sixth aspect, alone or in combination with one or more of the first through fifth aspects, encoding the codeword is performed using an encoder component associated with an error correction code engine of a memory device, wherein performing the first decoding procedure is performed using a first decoder component associated with the error correction code engine of the memory device, and wherein performing the second decoding procedure is performed using a second decoder component associated with the error correction code engine of the memory device.

Although FIG. 4 shows example blocks of a method 400, in some implementations, the method 400 may include additional blocks, fewer blocks, different blocks, or differently arranged blocks than those depicted in FIG. 4. Additionally, or alternatively, two or more of the blocks of the method 400 may be performed in parallel. The method 400 is an example of one method that may be performed by one or more devices described herein. These one or more devices may perform or may be configured to perform one or more other methods based on operations described herein.

In some implementations, a memory device includes one or more components configured to: receive a codeword that encodes a data vector, a parity vector associated with error correction of the data vector, and a metadata bit; and determine a value of the metadata bit by: performing a first decoding procedure to determine a first syndrome, wherein the first decoding procedure is based on using a first hypothesized value of the metadata bit; performing a second decoding procedure to determine a second syndrome, wherein the second decoding procedure is based on using a second hypothesized value of the metadata bit; and selecting, using the first syndrome and the second syndrome, one of the first hypothesized value of the metadata bit or the second hypothesized value of the metadata bit as the value of the metadata bit.

In some implementations, a method includes encoding a codeword that encodes multiple data bits associated with a portion of memory, multiple parity bits associated with error correction of the multiple data bits, and at least one metadata bit; performing a first decoding procedure using the codeword to determine a first decoded set of bits, wherein the first decoding procedure is based on using a first hypothesized value of the at least one metadata bit; performing a second decoding procedure using the codeword to determine a second decoded set of bits, wherein the second decoding procedure is based on using a second hypothesized value of the at least one metadata bit; and determining, using the first decoded set of bits and the second decoded set of bits, whether the first hypothesized value of the at least one metadata bit or the second hypothesized value of the at least one metadata bit is a value of the at least one metadata bit.

In some implementations, a memory device includes multiple error correction code engines, wherein each error correction code engine, of the multiple error correction code engines, includes multiple decoders, and wherein each error correction engine is configured to: receive a codeword that encodes a data vector, a parity vector associated with error correction of the data vector, and a metadata bit; and determine a value of the metadata bit by: performing, using a first decoder, of the multiple decoders, a first decoding procedure to determine a first syndrome, wherein the first decoding procedure is based on using a first hypothesized value of the metadata bit; performing, using a second decoder, of the multiple decoders, a second decoding procedure to determine a second syndrome, wherein the second decoding procedure is based on using a second hypothesized value of the metadata bit; and selecting one of the first hypothesized value of the metadata bit or the second hypothesized value of the metadata bit as the value of the metadata bit based on the first syndrome, the second syndrome, and syndromes determined by one or more other error correction code engines, of the multiple error correction code engines.

The foregoing disclosure provides illustration and description but is not intended to be exhaustive or to limit the implementations to the precise forms disclosed. Modifications and variations may be made in light of the above disclosure or may be acquired from practice of the implementations described herein.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

When "a component" or "one or more components" (or another element, such as "a controller" or "one or more controllers") is described or claimed (within a single claim or across multiple claims) as performing multiple operations or being configured to perform multiple operations, this language is intended to broadly cover a variety of architectures and environments. For example, unless explicitly claimed otherwise (e.g., via the use of "first component" and "second component" or other language that differentiates components in the claims), this language is intended to cover a single component performing or being configured to perform all of the operations, a group of components collectively performing or being configured to perform all of the operations, a first component performing or being configured to perform a first operation and a second component performing or being configured to perform a second operation, or any combination of components performing or being configured to perform the operations. For example, when a claim has the form "one or more components configured to: perform X; perform Y; and perform Z," that claim should be interpreted to mean "one or more components configured to perform X; one or more (possibly different) components configured to perform Y; and one or more (also possibly different) components configured to perform Z."

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A memory device, comprising:
one or more components configured to:
receive a codeword that encodes a data vector, a parity vector associated with error correction of the data vector, and a metadata bit; and
determine a value of the metadata bit by:
performing a first decoding procedure to determine a first syndrome, wherein the first decoding procedure is based on using a first hypothesized value of the metadata bit;
performing a second decoding procedure to determine a second syndrome, wherein the second decoding procedure is based on using a second hypothesized value of the metadata bit; and
selecting, using the first syndrome and the second syndrome, one of the first hypothesized value of the metadata bit or the second hypothesized value of the metadata bit as the value of the metadata bit.

2. The memory device of claim 1, wherein the parity vector is capable of providing error correction for up to a first quantity of bits,
wherein the data vector is associated with a second quantity of data bits and a third quantity of zero bits, and
wherein the second quantity is less than the first quantity.

3. The memory device of claim 1, wherein the one or more components are further configured to:
determine at least one of a first symbol error associated with the first syndrome or a second symbol error associated with the second syndrome,
wherein, to select the one of the first hypothesized value of the metadata bit or the second hypothesized value of the metadata bit as the value of the metadata bit, the one or more components are configured to use the at least one of the first symbol error associated with the first syndrome or the second symbol error associated with the second syndrome.

4. The memory device of claim 3, wherein the one or more components are further configured to correct one of the first symbol error associated with the first syndrome or the second symbol error associated with the second syndrome based on selecting the one of the first hypothesized value of the metadata bit or the second hypothesized value of the metadata bit as the value of the metadata bit.

5. The memory device of claim 3, wherein the one or more components are further configured to determine a position in the data vector associated with the at least one of the first symbol error associated with the first syndrome or the second symbol error associated with the second syndrome.

6. The memory device of claim 1, wherein the value of the metadata bit is one of 0 or 1,
wherein the first hypothesized value of the metadata bit is 0, and
wherein the second hypothesized value of the metadata bit is 1.

7. The memory device of claim 1, wherein the one or more components are associated with an error correction code engine, and
wherein error correction code engine includes a first decoder configured to perform the first decoding procedure and a second decoder configured to perform the second decoding procedure.

8. A method, comprising:
encoding a codeword that encodes multiple data bits associated with a portion of memory, multiple parity bits associated with error correction of the multiple data bits, and at least one metadata bit;
performing a first decoding procedure using the codeword to determine a first decoded set of bits, wherein the first decoding procedure is based on using a first hypothesized value of the at least one metadata bit;
performing a second decoding procedure using the codeword to determine a second decoded set of bits, wherein the second decoding procedure is based on using a second hypothesized value of the at least one metadata bit; and
determining, using the first decoded set of bits and the second decoded set of bits, whether the first hypothesized value of the at least one metadata bit or the second hypothesized value of the at least one metadata bit is a value of the at least one metadata bit.

9. The method of claim 8, wherein the multiple parity bits are capable of providing error correction for up to a first quantity of bits,
wherein the multiple data bits are associated with a data portion and a shortened portion,
wherein the data portion is associated with a second quantity of bits, and
wherein the second quantity of data bits is less than the first quantity of bits.

10. The method of claim 8, further comprising:
determining at least one of a first symbol error associated with the first decoded set of bits or a second symbol error associated with the second decoded set of bits,
wherein determining whether the first hypothesized value of the at least one metadata bit or the second hypothesized value of the at least one metadata bit is the value of the at least one metadata bit comprises using the at least one of the first symbol error associated with the first decoded set of bits or the second symbol error associated with the second decoded set of bits.

11. The method of claim 10, further comprising correcting one of the first symbol error associated with the first decoded set of bits or the second symbol error associated with the second decoded set of bits based on determining whether the first hypothesized value of the at least one metadata bit or the second hypothesized value of the at least one metadata bit is the value of the at least one metadata bit.

12. The method of claim 10, further comprising determining a position in the multiple data bits associated with the at least one of the first symbol error associated with the first decoded set of bits or the second symbol error associated with the second decoded set of bits.

13. The method of claim 8, wherein the value of the metadata bit is one of 0 or 1,
wherein the first hypothesized value of the metadata bit is 0, and
wherein the second hypothesized value of the metadata bit is 1.

14. The method of claim 8, wherein encoding the codeword is performed using an encoder component associated with an error correction code engine of a memory device,
wherein performing the first decoding procedure is performed using a first decoder component associated with the error correction code engine of the memory device, and wherein performing the second decoding procedure is performed using a second decoder component associated with the error correction code engine of the memory device.

15. A memory device, comprising:

multiple error correction code engines, wherein each error correction code engine, of the multiple error correction code engines, includes multiple decoders, and wherein each error correction engine is configured to:

receive a codeword that encodes a data vector, a parity vector associated with error correction of the data vector, and a metadata bit; and determine a value of the metadata bit by:

performing, using a first decoder, of the multiple decoders, a first decoding procedure to determine a first syndrome, wherein the first decoding procedure is based on using a first hypothesized value of the metadata bit;

performing, using a second decoder, of the multiple decoders, a second decoding procedure to determine a second syndrome, wherein the second decoding procedure is based on using a second hypothesized value of the metadata bit; and selecting one of the first hypothesized value of the metadata bit or the second hypothesized value of the metadata bit as the value of the metadata bit based on the first syndrome, the second syndrome, and syndromes determined by one or more other error correction code engines, of the multiple error correction code engines.

16. The memory device of claim 15, wherein the parity vector is capable of providing error correction for up to a first quantity of bits, wherein the data vector is associated with a second quantity of data bits and a third quantity of zero bits, and wherein the second quantity is less than the first quantity.

17. The memory device of claim 15, wherein each error correction code engine is further configured to:

determine at least one of a first symbol error associated with the first syndrome or a second symbol error associated with the second syndrome, wherein, to select the one of the first hypothesized value of the metadata bit or the second hypothesized value of the metadata bit as the value of the metadata bit, each error correction code engine is configured to use the at least one of the first symbol error associated with the first syndrome or the second symbol error associated with the second syndrome.

18. The memory device of claim 17, wherein each error correction code engine is further configured to correct one of the first symbol error associated with the first syndrome or the second symbol error associated with the second syndrome based on selecting the one of the first hypothesized value of the metadata bit or the second hypothesized value of the metadata bit as the value of the metadata bit.

19. The memory device of claim 17, wherein each error correction code engine is further configured to determine a position in the data vector associated with the at least one of the first symbol error associated with the first syndrome or the second symbol error associated with the second syndrome.

20. The memory device of claim 15, wherein the value of the metadata bit is one of 0 or 1, wherein the first hypothesized value of the metadata bit is 0, and wherein the second hypothesized value of the metadata bit is 1.

* * * * *